United States Patent
Tanaka et al.

[19]

[11] Patent Number: 5,811,211
[45] Date of Patent: Sep. 22, 1998

[54] PERIPHERAL EDGE EXPOSURE METHOD

[75] Inventors: Shouji Tanaka; Masao Nakajima; Toshichika Toma, all of Kanagawa-ken, Japan

[73] Assignee: Nikon Corporation, Tokyo, Japan

[21] Appl. No.: 690,837

[22] Filed: Aug. 1, 1996

[30] Foreign Application Priority Data

Aug. 4, 1995 [JP] Japan .................................. 7-200076

[51] Int. Cl.$^6$ ................................................. G03C 5/00
[52] U.S. Cl. ........................... 430/30; 430/311; 430/322; 430/327; 382/145
[58] Field of Search .................. 430/5, 22, 30, 430/311, 322, 327; 382/145

[56] References Cited

U.S. PATENT DOCUMENTS

| | | | |
|---|---|---|---|
| 4,899,195 | 2/1990 | Gotoh | 355/77 |
| 4,910,549 | 3/1990 | Sugita | 355/53 |
| 5,168,304 | 12/1992 | Hattori | 335/50 |
| 5,229,811 | 7/1993 | Hattori et al. | 355/50 |
| 5,250,983 | 10/1993 | Yamamura | 430/5 |
| 5,439,764 | 8/1995 | Alter et al. | 430/5 |
| 5,650,250 | 7/1997 | Moon | 430/5 |

FOREIGN PATENT DOCUMENTS

| | | | |
|---|---|---|---|
| 59 75627 | 4/1984 | Japan | 430/22 |
| 3108315 | 5/1991 | Japan | 430/22 |

*Primary Examiner*—Christopher G. Young
*Attorney, Agent, or Firm*—Armstrong, Westerman, Hattori, McLeland & Naughton

[57] ABSTRACT

A photosensitive substrate is exposed with both a peripheral edge exposure apparatus which exposes the peripheral portion of the photosensitive substrate in a specified exposure width and a pattern exposure apparatus which transfers a scale pattern to the photosensitive substrate so that a dimension from the outer periphery of the photosensitive substrate is known. The accuracy (offset quantity) of the exposure width of the peripheral edge exposure apparatus is evaluated by reading out the resist image of the scale pattern which appears on the substrate after development.

7 Claims, 24 Drawing Sheets

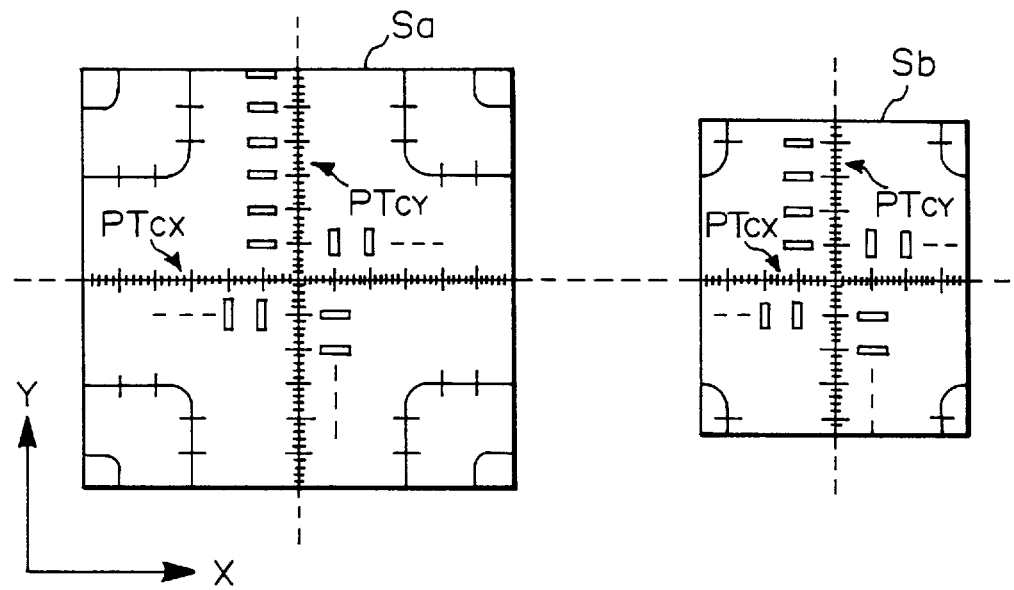
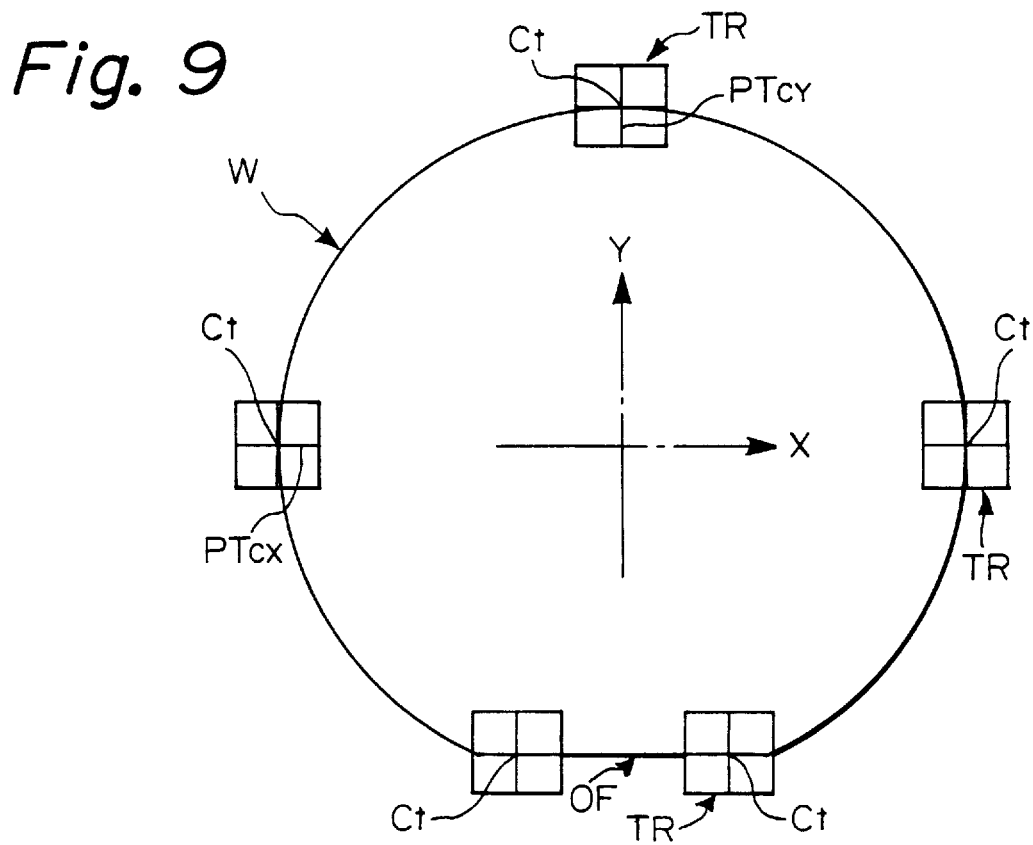

Fig. 20

| REGION | TARGET EXPOSURE QUANTITY | ANGULAR POSITION | SPEED | SHUTTER TIME |
|---|---|---|---|---|
| $AP_1$ | 170 mJ | $\theta_1, \Delta\theta_p$ | $V_1$ | $T_{S1}$ |
| $AP_2$ | 180 mJ | $\theta_2, \Delta\theta_p$ | $V_2$ | $T_{S2}$ |
| $AP_3$ | 190 mJ | $\theta_3, \Delta\theta_p$ | $V_3$ | $T_{S3}$ |
| ⋮ | ⋮ | ⋮ | ⋮ | ⋮ |
| $AP_N$ | 220 mJ | $\theta_N, \Delta\theta_p$ | $V_N$ | $T_{SN}$ |

PERIPHERAL EDGE EXPOSURE METHOD

BACKGROUND OF THE INVENTION

1. Field of the Invention

The present invention relates to a method and an apparatus for exposing the peripheral portion of a substrate or the like which is used in a process of fabricating semiconductor devices, liquid crystal display devices, or the like. Furthermore, the present invention also relates to a lithographic method and a lithographic apparatus which use such a peripheral-exposure method. More particularly, the invention relates to the aforementioned method and apparatus for exposing the peripheral portion of a sensitive substrate, such as a semiconductor wafer or glass plate on which a sensitive layer is deposited, in a predetermined width.

2. Description of the Related Art

As a peripheral edge exposure apparatus for photosensitive substrates used in a lithographic process, a wide variety of methods have so far been proposed and put into practice. A peripheral edge exposure apparatus such as this is used for the purpose of uniformly removing, at the time of development, a photoresist layer coated on the peripheral portion of a photosensitive substrate (such as a circular wafer and a rectangular wafer). Thus, the reason why the resist layer of the peripheral portion of the photosensitive substrate is removed is for preventing the peripheral edge of the substrate from contacting various members, part of the resist layer from being peeled off, and the resist powder from adhering to the front or back surface of the substrate as a foreign substance, when the photosensitive substrate is accommodated into the substrate carrier after development or when the substrate is being conveyed to a processing equipment for chemically processing the substrate.

A system, where the aforementioned peripheral edge exposure apparatus is provided in the wafer prealignment section of a pattern exposure apparatus which projects and transfers circuit patterns on a mask to a wafer, is disclosed in (1) Japanese Laid-Open Patent Publication No. Sho 58-139144. In the apparatus shown in this publication, the peripheral portion of the wafer is exposed by using a wafer rotary table provided in the wafer pre-alignment section for orientating the orientation flat (flat portion) of the wafer in a fixed direction and an optical fiber which irradiates exposure light toward the peripheral portion of the wafer.

Also, peripheral edge exposure apparatus, provided with a tracking mechanism for controlling the width of exposure light to a constant over the overall margin of a wafer when the wafer margin is exposed, are disclosed in (2) U.S. Pat. No. 4,910,549, (3) U.S. Pat. No. 4,899,195, (4) U.S. Pat. No. 5,168,304, and (5) U.S. Pat. No. 5,229,811.

In the apparatuses shown in the publications (2) and (3) among the aforementioned publications, the radial position of the peripheral edge of a wafer is detected by a light source and a photoelectric sensor used for peripheral detection, while rotating the wafer, and based on the detection result, the position of an emergent or emitting end of an optical fiber used for exposure of peripheral edge is servo controlled in the radial direction of the wafer so that the width of exposure light becomes constant.

In addition, in the equipment shown in the aforementioned publication (4), an optical fiber for exposing the margin of a wafer also serves as a light source for detecting the radial position of the peripheral edge of the wafer. While the wafer is being exposed with exposure light rays used for exposure of peripheral edge, the position of the peripheral edge of the wafer is detected by photoelectrically detecting the light beam which is not shuttered with the peripheral edge of the wafer among the exposure light rays. Based on the detection result, the position of the emitting end of the optical fiber is servo controlled in the radial direction of the wafer.

Furthermore, in the apparatus shown in the aforementioned publication (5), a light beam of non-exposure wavelength is irradiated on the peripheral edge of a wafer from an optical fiber for exposure of peripheral edge during rotation of the wafer, and there is provided a dummy tracking mechanism which servo controls the position of the emitting end of the optical fiber in response to a photoelectric detection signal of the light beam that is not shuttered with the peripheral edge of the wafer among the non-exposure light beams. And, when exposure light is emitted from the optical fiber to perform principal exposure, the emitting end of the optical fiber is servo controlled so that the position information on the emitting end of the optical fiber, stored at the time of dummy tracking, is reconstructed.

Besides the aforementioned peripheral edge exposure method which irradiates the peripheral portion of a wafer with exposure light from an optical fiber while rotating the wafer, there is a method known as (6) U.S. Pat. No. 4,518,678, where a circular shading mask slightly smaller than the outer dimension of a wafer is superimposed on the wafer and exposure light is uniformly irradiated on the shading mask to expose the peripheral portion of the wafer in a predetermined width.

It is the tracking method that can precisely control exposure light width relatively and has better operability among the aforementioned wide variety of peripheral edge exposure methods. Generally in the tracking method, the emitting end of the optical fiber is arranged near the front surface of the peripheral portion of the wafer to less than a few millimeters, and the photoelectric sensor, which receives the light beam which is not shuttered with the edge of the photosensitive substrate among the light beams (exposure light beams and non-exposure light beams) from the optical fiber, is also arranged near the back surface of the photosensitive substrate.

With the aforementioned arrangement, the level on the photoelectric signal from the photoelectric sensor corresponds to the exposed width of the peripheral portion of the substrate irradiated with light from the optical fiber. However, the numerical aperture (NA) of the optical fiber at the emitting or emergent end is usually large and so the divergent angle of the light from the emitting end also becomes large, so that errors occur in the exposure light width due to a change in the spacing between the photosensitive substrate and the emitting end of the optical fiber.

In addition, the intensity distribution of the exposure light from the optical fiber is not always uniform on the photosensitive substrate, but it has particular inclination in the boundary portion between the exposed portion and the non-exposed portion of the peripheral portion on the resist layer, that is, the peripheral portion of exposure light prescribing the edge portion of the resist layer of the peripheral portion of the substrate which remains unremoved at the time of development. For this reason, as long as such an intensity distribution is not improved, there is the possibility that errors will occur more or less in the exposure light width (removed width) due to a change in the spacing between the photosensitive substrate and the emitting end of the optical fiber.

Moreover, because the level on the photoelectric signal form the photoelectric sensor also changes due to the change in the spacing between the photosensitive substrate and the emergent end of the optical fiber, a steady-state tracking error (offset) will occur in the exposure light width specified by an operator.

Therefore, to confirm the precision degradation in the exposure light width (removed width) due to the aforementioned errors, it is necessary to visually observe an actual exposure light width (removed width) obtained by test exposure and development.

However, to accurately measure the width of the resist layer of the peripheral portion or edge exposed and removed, a caliper gauge or a rule must be put on the developed photosensitive substrate and so there is the problem that the operability of an operator is bad. In the measurement there is a large individual difference and so there is also the problem that the measurement is not always stable.

Furthermore, even if the tracking accuracy of the peripheral edge exposure apparatus is high enough and the control of the exposure light width is possible with a resolution of about 0.2 to 0.5 mm, it would not be necessary to mention that an operation of placing a caliper gauge or a rule on the developed photosensitive substrate to measure the error of that degree is troublesome.

On the other hand, it is important in this kind of exposure that the resist layer of the outer peripheral edge portion is removed with reliability at the time of development, and a quantity of exposure appropriate to the resist layer, that is, a quantity of dose needs to be given with accuracy. In this case, the control of the exposure quantity is achieved by any one or a combination of some of adjustment of the intensity of light that a light source for peripheral exposure emits, adjustment of the transmission factor of an extinction filter disposed in an optical path into which exposure light is irradiated, adjustment of the width of slit-shaped exposure light projected on a photosensitive substrate (the dimension in the traveling direction of a substrate), adjustment of the spacing between an optical element (optical fiber or lens) for emitting exposure light and a photosensitive substrate, and adjustment of the relative traveling speed between a photosensitive substrate and exposure light (the rotational speed of a wafer).

When peripheral exposure such as described above is performed, in the conventional wafer-peripheral-edge exposure apparatuses many wafers are flown in advance by trial and error to confirm an appropriate quantity of exposure. More specifically, exposure time T (rotational speed) is calculated from only an appropriate dose quantity $S_r$ of the resist, and the peripheral exposure is performed to obtain an appropriate quantity of exposure, while changing the calculated exposure time T by a constant value at a time for each wafer. Then, after development, the minimum exposure time (maximum rotational speed) when the remaining resist film does not come to be recognized is specified.

However, since an appropriate quantity of exposure varies considerably depending on the kind and thickness of a resist, it is an extremely troublesome operation to flow many wafers each time the appropriate quantity varies, to confirm the rate at which the resist film remains unremoved.

SUMMARY OF THE INVENTION

A primary object of the present invention is to provide a peripheral edge exposure method which is capable of simply confirming accuracy of an exposure width when the margin of a substrate is exposed.

Another object of the present invention is to provide a novel peripheral edge exposure method and apparatus which are capable of easily detecting the removed width of the resist layer of the exposed margin of a substrate by visual inspection.

Still another object of the present invention is to provide a lithographic method and equipment that use the aforementioned peripheral edge exposure method and apparatus.

A further object of the present invention is to provide a lithography method which is capable of accurately confirming precision of the width of a wafer margin exposed by a peripheral edge exposure apparatus and accurately correcting the control offset of the peripheral edge exposure apparatus from the confirmed precision.

A further object of the present invention is to provide a lithography system where a carrier mechanism for mutually carrying a photosensitive substrate between an exposure device for pattern exposure and a peripheral edge exposure apparatus for peripheral exposure is provided, the pattern exposure device transfers a scale pattern to the peripheral portion of the photosensitive substrate, and the peripheral edge exposure apparatus exposes the peripheral edge or portion of the photosensitive substrate in a uniform width so that part of the exposed image of the scale pattern remains unremoved.

A further object of the present invention is to provide a peripheral edge exposure method and apparatus which are capable of simply and easily determining an appropriate exposure quantity when the margin of a substrate is exposed.

A first peripheral edge exposure method according to the present invention comprises the steps of: transferring an image of a scale pattern which indicates an actual dimension on said substrate to the sensitive layer of a peripheral region of said substrate so that a dimension from the outer periphery of said substrate is expressed; and exposing said sensitive layer in the peripheral region of said substrate in a width such that at least part of the image of said scale pattern transferred to said sensitive layer in the peripheral region of said substrate remains unremoved.

A second peripheral edge exposure method according to the present invention comprises the steps of: separately setting a plurality of divided exposure regions on the margin outer periphery of said substrate in the circumferential direction of said substrate, and exposing the sensitive layers in said plurality of divided exposure regions in different target exposure quantities; and developing the plurality of divided exposure regions which have been exposed and then inspecting a remaining film of the sensitive layer of said divided exposure region to determine an appropriate exposure quantity with respect to said divided exposure region.

In the aforementioned peripheral edge exposure method, said appropriate exposure quantity may be a value which is the product of a minimum target exposure quantity where the remaining film of said sensitive layer becomes near zero, among a plurality of target exposure quantities, and a predetermined value.

A first peripheral edge exposure apparatus according to the present invention comprises a rotating device for rotating a substrate with a sensitive layer about an axis substantially perpendicular to a surface of the substrate, an exposure device for irradiating exposure light to a peripheral region of said substrate to expose said sensitive layer, a light quantity by device for adjusting an exposure quantity by said exposure device and a setting device for separately setting a plurality of divided exposure regions on the whole peripheral region of said substrate in the circumferential direction of said substrate and setting target exposure quantities which are given to the sensitive layers of said plurality in divided exposure regions to different values.

In the aforementioned peripheral edge exposure apparatus, said light quantity adjusting device may include a device for measuring and storing the intensity of the exposure light irradiated by said exposure device and a device for controlling the rotational speed of said rotating device, based on said target exposure quantities set and said intensity of the exposure light stored. Also, the exposure device may include an optical fiber for guiding exposure light from a light source to the peripheral portion of said substrate and an optical holder for holding the optical fiber keeping the spacing between an emitting end of said optical fiber and a surface of said substrate in a predetermined value, and the light quantity adjusting device may include a device for controlling at least one of the intensity of the exposure light of said light source, the rotational speed of said rotating device, and the spacing between the emitting end of said optical fiber and the surface of said substrate, based on said set target exposure quantities. Furthermore, the setting device may set N target exposure quantities which include a target exposure quantity where approximately appropriate exposure is performed and which are increased or decreased by a predetermined quantity at a time, and may sets the rotational angular ranges as said divided regions, said rotational angular ranges being determined by a value less than an angular quantity with which the whole peripheral region of said substrate is divided into N equal parts.

A second peripheral edge exposure apparatus of the present invention comprises a holding member for holding a substrate having a photoresist layer formed on the whole surface, a light irradiating device for emitting exposure light with a predetermined shape to part of the peripheral region of said substrate, a device for relatively moving said substrate and said light irradiating device along said peripheral region for irradiating said exposure light along said peripheral region, a light quantity adjusting device for controlling an exposure quantity with respect to the photoresist layer in said peripheral region, and a setting device for setting a first parameter which represents a plurality in divided exposure regions different from each other of said peripheral region and a second parameter which makes target exposure quantities different from each other, said target exposure quantities being given to the photoresist layers in said plurality of divided exposure regions.

In the aforementioned peripheral edge exposure apparatus, said setting device may include an input unit for inputting various kinds of commands and set values, a display unit for displaying various kinds of set parameters and the state of a device, and a computer for executing various kinds of calculations and programs, and said computer may output graphical information of an arrangement of said plurality of divided exposure regions set on said substrate, based on the set values, to display the arrangement on said display unit.

A lithography method according to the present invention comprises the steps of: transferring an image of a scale pattern which indicates an actual dimension on said substrate to the sensitive layer in a peripheral region of said substrate so that a dimension from the outer periphery of said substrate is expressed; exposing said sensitive layer in the peripheral region of said substrate in a width such that at least part of the image of said scale pattern transferred to said sensitive layer in the peripheral region of said substrate remains unremoved; and removing the exposed sensitive layer in the peripheral region of the substrate and reading the width of the removed portion of the sensitive layer by means of the image of said scale pattern, and detecting an error between the width of the removed portion et width.

A lithography system of the present invention comprises a first exposure apparatus which has a substrate moving section for two-dimensionally moving a substrate with respect to a mask with a pattern and transfers an image of said pattern to said substrate, a second exposure apparatus for exposing a peripheral portion of said substrate in a predetermined target width, a first control device for controlling said first exposure apparatus so that an image of a scale pattern which indicates an actual dimension on said substrate is transferred along a direction of a target width at the time of peripheral exposure, and a second control device for controlling said second exposure apparatus so that the peripheral edge of said substrate is exposed in a target width such that at least part of an image of said scale pattern which is transferred on the peripheral portion of said substrate remains unremoved.

In the aforementioned lithography system may further comprise a third control device for controlling a carrying operation of a carrier device which carries said substrate, in such a manner that a sheet of wafer can receive scale pattern exposure processing which is performed by said first exposure apparatus and exposure processing which is performed by said second apparatus.

In accordance with the first peripheral edge exposure method and the lithography method and system according to the present invention, a scale pattern is transferred to the peripheral portion of a photosensitive substrate so that the width of a resist layer which is removed by exposure can be directly read. Therefore, an accurate exposure width (removed width) can be simply known only by directly reading the graduation of the scale pattern formed on the resist layer remaining on the photosensitive substrate after development. For this reason, it becomes possible to easily confirm the control precision of the exposure width of the peripheral edge exposure apparatus and accurately make a calibration.

In addition, if the aforementioned scale pattern is formed in a reticle (mask) and is mounted in a peripheral edge exposure apparatus, which has an illumination system with a variable illumination field diaphragm (variable blind), to expose a photosensitive substrate, a similar scale pattern can also be used for test exposure, which is performed for confirming the set precision of the edge of the hole of the variable blind.

Furthermore, a pattern exposure apparatus, which is used in the aforementioned method and apparatus, is generally a step-and-repeat type, a step-and-scan type, a uniform magnification projection type, or proximity type where ultraviolet light (of wavelength 180 to 440 nm) from a mercury lamp or laser beam source is used as exposure light. The pattern exposure apparatus may comprise an exposure apparatus which uses an X ray, an electron beam, or a charged particle beam as exposure light.

Particularly in an exposure apparatus of the type, which deflects a beam spot or a variable shape beam, based on pattern picture data, a scale pattern for confirming an exposure width obtained by peripheral exposure is transferred as a video image, if the picture data of the scale pattern is prepared in advance and is aligned with the peripheral portion of a sensitive substrate and a picture beam is deflected.

Furthermore, if the scale pattern has graduations which indicate an actual dimension on the photosensitive substrate, the scale pattern can be easily read after development. Reading of the scale pattern can be performed by using the viewing function of various kinds of alignment systems provided in the pattern exposure apparatus, but it may be performed with an entirely different microscope. Also, the peripheral edge exposure apparatus and the pattern exposure apparatus, which are used in the method of the present invention, may be formed integrally or separately.

In accordance with another peripheral edge exposure method of the present invention, an exposure quantity which is given to mutually different peripheral portions of a sheet of photosensitive substrate (wafer, plate) is varied with a predetermined rate. Therefore, after development of the photosensitive substrate, an operation of confirming the state of the remaining resist film becomes much easier. More specifically, since an optimum dose quantity can be found out with the visual observation of only a sheet of photosensitive substrate, there is no need for comparing many photosensitive substrates as in prior art.

Most plates for liquid crystal display element fabrication are large (e.g., 40 cm square), and in such a case, operability is considerably enhanced because an optimum dose quantity can be confirmed with only a sheet of plate, as in the present invention.

In addition, the present invention has the advantage that a mistaken recognition is difficult to occur, because the states of remaining resist films are confirmed between adjacent local regions on the peripheral portion of a sheet of photosensitive substrate.

BRIEF DESCRIPTION OF THE DRAWINGS

The above and other objects and advantages will become apparent from the following detailed description when read in conjunction with the accompanying drawings wherein:

FIGS. 8A and 8B are diagrams showing pattern images formed on the wafer W with the test reticle of FIG. 5, respectively;

FIG. 9 is a diagram showing the position on the wafer W which is exposed with the pattern image of the test reticle of FIG. 5;

FIG. 20 is a table diagram showing an example of the internal parameters produced in the peripheral edge exposure apparatus at the time of test exposure;

DESCRIPTION OF THE PREFERRED EMBODIMENTS

Figure 1:
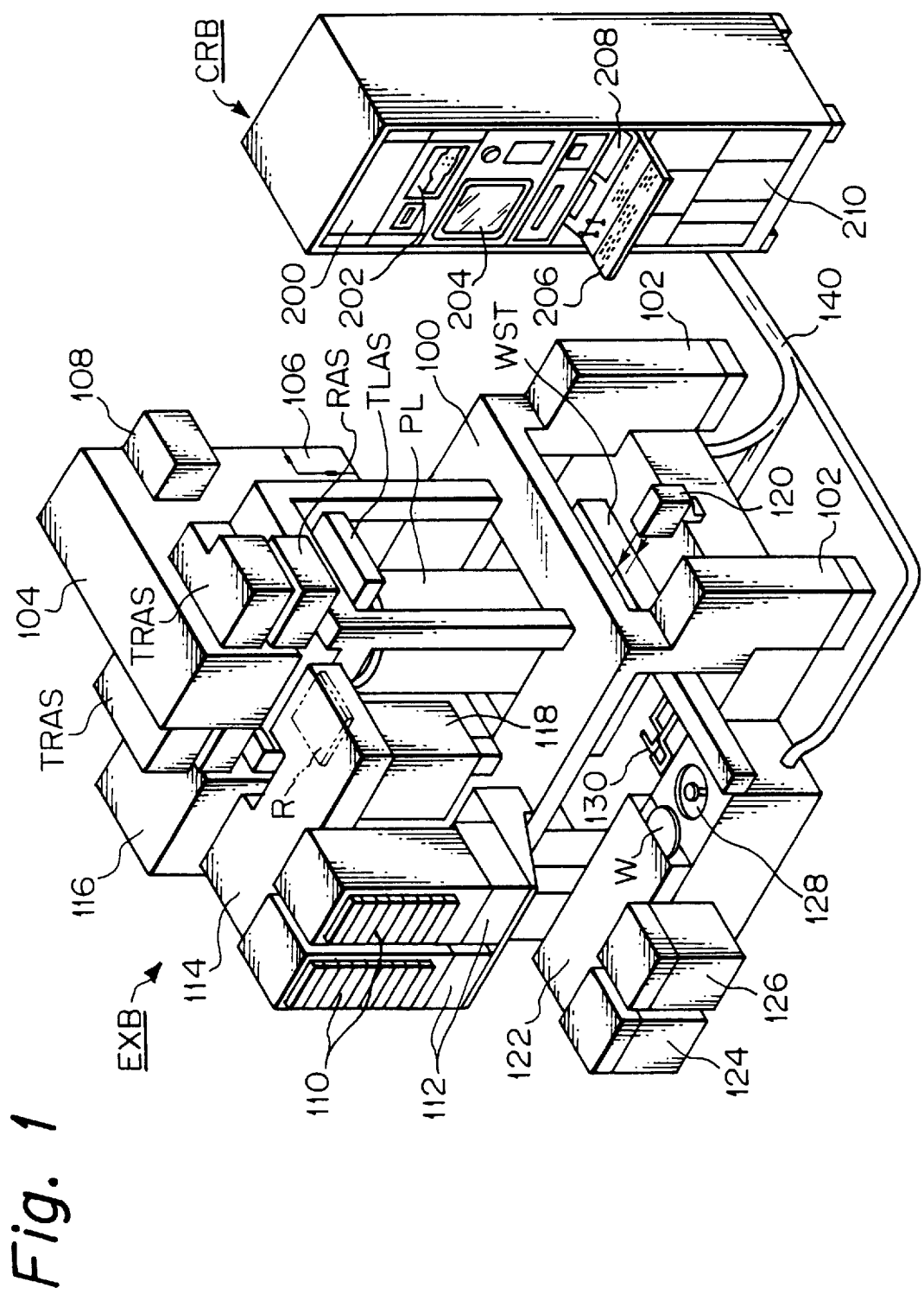
FIG. 1 is a perspective view showing an embodiment of a lithographic equipment of the present invention.

A preferred embodiment of the present invention will hereinafter be described in detail in reference to the drawings. FIG. 1 shows the overall structure of a lithography system to which the present invention is applied. This lithography system is constituted by an exposure apparatus main assembly EXB which projects an original picture pattern on a photosensitive substrate, such as a semiconductor wafer, on a reduced scale, and a control rack CRB on which the various electrical control systems of the main assembly EXB are centered.

As in FIG. 1, the main assembly EXB, constructed on a column structure 100, is installed on a floor surface through vibration proof mechanisms 102. Above the column structure 100 there is provided an illumination system 104 for illuminating a reticle R which becomes the original of circuit patterns with uniform exposure light. The illumination system 104 includes a lamp housing section 106 which houses a light source, such as a mercury vapor lamp, and a shutter in addition to a large number of optical elements (lenses or mirrors) and also includes a switching section 108 for switching the illumination condition of the exposure light used for illuminating the reticle R.

The patterned images on the reticle R illuminated with exposure light is projected on a wafer W placed on a wafer stage WST through a double-sided telecentric projection lens PL disposed on the central portion of the column structure 100. The reticle R is carried by a reticle carrier system 114 from a reticle library 110 provided on the front side of the main assembly EXB to a reticle stage (not shown) provided above the projection lens PL.

The reticle library 110 is detachably loaded with a plurality of reticle cases each having the reticle accommodated therein. And, the reticle carrier system 114 takes out a specified sheet of reticle R from the corresponding reticle case and then carries it onto the reticle stage through a predetermined carrier path.

In part of the carrier path between the reticle library 110 and the reticle stage, there is provided a reticle cache 118 which temporarily holds a plurality of reticles (e.g., 2 reticles through 6 reticles), which remain naked, for high-speed exchange of a reticle to be used in exposure. Also, below the reticle library 110 there is provided a pellicle inspection section 112 for inspecting the existence of foreign substances which adhered to the pellicle surface of the reticle having a pellicle deposited thereon. Behind the reticle library 110 there is also provided a reticle inspection section 116 for inspecting the existence of foreign substances which adhered to the pattern surface of the reticle R or glass surface.

On the other hand, the wafer W which is placed on the wafer stage WST is taken out by a wafer carrier system 122 (where the carrier path thereof is filled with clear air isolated from outside air) from a wafer carrier accommodated in a pod 124 or 126 filled with clean constant-temperature air and is carried through a prealignment section 128. The prealignment section 128 has a prealignment function of both aligning the flat (OF) or notch of the wafer W being carried from the pod 124 or 126 in a predetermined angular direction and measuring the positional offset of the wafer in the translational directions (X and Y directions).

Figure 2:
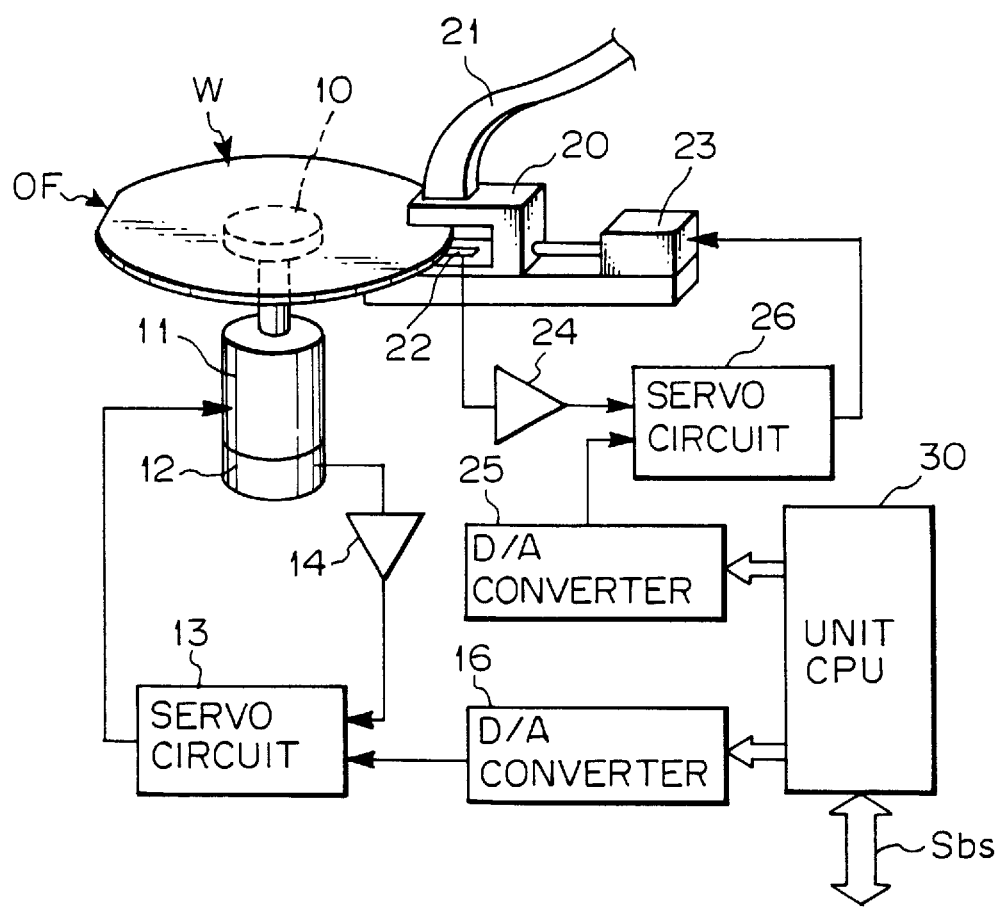
FIG. 2 is a block diagram showing the unit structure of a peripheral edge exposure apparatus mounted in the lithographic equipment of FIG. 1.

The prealignment section 128 is also equipped with a turn table which turns more than 360° for aligning the flat or notch of the wafer in the predetermined angular direction. The prealignment section 128 is furthermore provided with a peripheral edge exposure apparatus for uniformly exposing the peripheral portion of the wafer W in a predetermined width (e.g., about 1 to 5 mm) in cooperation with the turn table and removing only the resist layer of the peripheral portion after wafer development. The peripheral edge exposure apparatus, while constructed as shown in FIG. 2, will be described later.

Incidentally, the wafer W, which was prealigned in the prealignment section, and whose peripheral portion or edge was exposed depending on the sequence, is carried onto the wafer stage WST by a load-unload mechanism 130. The patterns on the wafer W carried on the wafer stage WST is then exposed. The exposed wafer W is transferred through the space above the prealignment section 128 to an arm on the side of the wafer carrier system 122 and furthermore is returned to the wafer carrier within the pod 124 or 126.

Notice that when the peripheral edge exposure process is performed after the pattern exposure process using the reticle R is completed, the wafer W taken out from the wafer stage WST is prealigned in the prealignment section 128 and the geometrical center of the wafer W is aligned within a predetermined positional error (e.g., a few millimeters) with respect to the rotational center of the turn table used at the time of exposure. This alignment is likewise performed also even in a case where the peripheral edge exposure process is carried out before the pattern exposure process.

Incidentally, to transfer the patterns on the reticle R to the wafer W in precise alignment with the wafer W, this kind of wafer stage WST is provided with laser interferometers 120, which measure the two-dimensional coordinate positions of the wafer stage WST (indirectly the wafer W) in sequence. The wafer stage WST is also provided with a plurality of drive motors for moving the stage WST in X and Y directions, based on the values measured by the interferometers 120. These drive motors are controlled in an optimum condition corresponding to each sequence by a stage control unit including a CPU.

Also, various kinds of alignment systems RAS, TRAS, and TLAS are provided for precisely disposing an exposed region on the wafer W at a predetermined position within the visual field of projection of the projection lens PL.

The alignment system RAS aligns the reticle by photo-electrically detecting a reticle alignment mark formed in the margin of the reticle R placed on the reticle stage such that the center point of the rectangular pattern region or area of the reticle R substantially coincides with the optical axis of the projection lens PL.

The alignment system TRAS is used to photoelectrically detect both a die-by-die (D/D) alignment mark formed in the outer periphery of the pattern area of the reticle R and a D/D alignment marks formed in a corresponding shot area or region on the wafer at the same time to precisely align the pattern area of the reticle R directly with the corresponding shot area on the wafer W.

The alignment system TLAS photoelectrically detects a TTL alignment mark on the wafer W through the peripheral portion within the visual field of projection of the projection lens PL from the lower side of the reticle R and detects the coordinate positions of the TTL mark within the wafer coordinate system in cooperation with the laser interferometers 120. With this detection, the shot area on the wafer W is aligned with respect to the visual field of projection of the projection lens PL or the projected image of the pattern area of the reticle R.

Also, an off-access alignment system OFAS, although not shown in FIG. 1, is provided which optically enlarges the TTR or TTL mark of the wafer W through an objective lens disposed near the projection lens PL and which is equipped with both a function of photographing and visually observing the enlarged image with a charged-coupled device (CCD) camera and a function of detecting the mark position by digitally processing the image signal from the CCD camera.

Furthermore, the aforementioned alignment systems RAS, TRAS, TLAL, and OFAS can also detect a corresponding reference mark on a fiducial plate fixed on the wafer stage WST. The reference mark is used for automatic calibration of each alignment system and for confirming the base line quantity between the center of detection of each alignment system and the projected point of the pattern region center of the reticle R.

An electric control system, which controls the aforementioned various kinds of functional units (reticle carrier unit 114, wafer carrier unit 122, prealignment section 128, each alignment system, etc.) in the main assembly EXB of the system, as a plurality of unit control boards 210 (including a CPU, semiconductor memories, various kind of analog processing circuits, logic circuits, etc.) in the lower portion of the control rack CRB. The plurality of unit control boards 210 are synthetically controlled by a minicomputer 202 equipped with a hard magnetic disk as an external memory device.

The uppermost power supply section 200 of the control rack CRB supplies a direct current constant voltage to each unit control board 210. Furthermore, the minicomputer 202 controls a color CRT or a liquid crystal display 204 for man-machine interface and also controls an operation panel desk (OPD) 206 where a keyboard portion, various kinds of changing switches, adjustment controls, and joysticks are integrally formed.

The OPD 206 is also provided with a numerical display portion 208 which digitally displays coordinate positions of the wafer stage WST, environmental atmospheric pressure, environmental temperature, projection lens temperature, and air conditioning temperature of each part, which are measured with the laser interferometer 120, with red in real time. Furthermore, the OPD 206 protrudes from the front surface of the control rack section CRB at a height such that an operator can easily operate in a standing state, and is provided so that it can be slidably accommodated into the rack section CRB.

Also, the display 204 displays the contents of a plurality of commands or parameters used in programs for operating various kinds of control units of the main assembly EXB, various kinds of measured data or conditions, states of the system, states of occurrence of errors or troubles, and instructions for recovery of the errors or troubles. Furthermore, the display 204 is also equipped with a function of displaying part (e.g., 0.1 to 2 mm square) of an image of the wafer surface which is photographed with a telecamera incorporated in various kinds of alignment systems.

The aforementioned control rack CRB and main assembly EXB are interconnected with a cable 140 used for power supply, exchanges of various signals between electrical systems, supply of vacuum or compressed air, and supply of a cooling medium.

FIG. 2 is a block diagram showing the unit structure of the peripheral edge exposure apparatus provided in the wafer prealignment section 128. If the wafer W is carried to the prealignment section 128, the wafer W is held on the turn table 10 by vacuum suction so that the centers are aligned with each other. The turn table 10 is rotated by a motor 11, and the rotational speed is detected by a tacho-generator 12. A servo circuit 13 drives the motor 11 so that a deviation is made near zero between a speed signal output from the tacho-generator 12 through an amplifier 14 and a target value signal supplied from a D/A converter 16. With this control, the wafer W is rotated at an angular speed corresponding to the target value signal from the D/A converter 16.

On the other hand, the mechanism for exposing the peripheral edge or portion of the wafer W is constituted by a slider 20 and a motor 23 for linearly moving the slider in the radial direction of the wafer W. The slider 20 integrally retains the emergent or emitting end of an optical fiber 21 which guides exposure light to the peripheral portion of the photosensitive surface of the wafer and a photoelectric element 22 which receives the light beam that advances on the back side of the wafer without being shuttered with the wafer edge among the exposure light beams from the emitting end of the optical fiber 21.

The position of the slider 20 is controlled by the amplifier 24 which amplifies the photoelectric signal of the photoelectric element 22, the D/A converter 25 which outputs the target value signal, and the servo circuit 26 which drives the motor 23 so that the deviation between the target value signal and the output signal from the amplifier 24 is made near zero.

The unit CPU 30 outputs both a digital value which indicates the rotational speed of the turn table 10 to the D/A converter 16 and a digital value which indicates the exposure light width of the wafer edge (the radial dimension from the wafer edge) to the D/A converter 25. By appropriately setting these digital values, the entire peripheral edge of the wafer W is tracked and exposed in a constant exposure light width within a range of about 1 to 6 mm. Also, the CPU 30 in this embodiment is provided in the unit control board 210 of the control rack section CRB of FIG. 1 and synthetically controls the concrete sequence as to peripheral exposure.

The information on at least the width and quantity of peripheral exposure is input from the keyboard of the OPD 206 to the minicomputer 202 by an operator, and thereafter is set to the CPU 30 through a bus $S_{bs}$ at suitable timing. The exposure width is specified in units of 0.5 mm, such as 3.5 mm and 5.5 mm. The minimum unit is determined in correspondence with the tracking ability of the slider 20 of the peripheral edge exposure apparatus. If the exposure apparatus is properly adjusted, an error between the exposure width specified by the operator and the width of the resist layer that is actually exposed and removed can be suppressed to the minimum unit. However, if the apparatus adjustment is not proper, of course the error will be increased.

Figure 3:
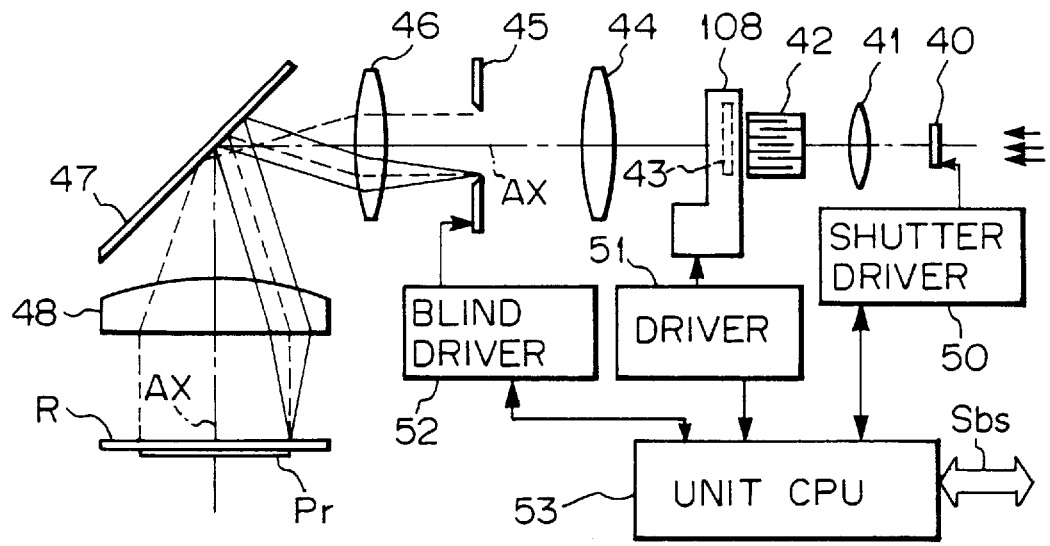
FIG. 3 is a diagram showing part of the illumination system of the main body of the exposure apparatus mounted in the lithographic equipment of FIG. 1.

Incidentally, part of the illumination system 104 of the main assembly EXB of the exposure apparatus shown in FIG. 1 is concretely constructed as in FIG. 3. Exposure light from the light source is admitted onto the lens system 41 through the shutter 40. The light is collimated by the lens system 41 and admitted into an optical integrator (fly eye lens) 42. On the emitting side of the integrator 42 a plurality of secondary light source images are formed as a surface, and there is exchangeably disposed a space filter 43 forming the essential part of a switching section 108 which switches the illumination condition of exposure light. The space filter 43 is constituted by a shuttering plate for shaping the effective surface form of the secondary light source images into circles, zones, or two or four separated sectors.

Now, the exposure light beams from the secondary light source images, shaped by the space filter 43, are distributed in uniform illuminance on a variable blind 45 serving as a variable illumination field stop by a collective lens 44. The variable blind 45 has a rectangular aperture for prescribing an illuminated region on the reticle R. The exposure light transmitted through the rectangular aperture uniformly illuminates a rectangular pattern region $P_r$ on the reticle R through a lens system 46, a mirror 47, and a condenser lens 48. More specifically, by a combination of the lens system 46 and the condenser lens 48, the rectangular aperture image of the variable blind 45 is magnified two or three times and formed so that it matches the contour of the pattern region $P_r$ of the reticle R.

In the aforementioned arrangement, opening and closing of the shutter 40 is controlled by a shutter drive section 50, and the switching of the space filter 43 of the switching section 108 is controlled by a drive section 51. Also, the respective positions XL, XR, YU, and YD of the straight edges of four sides prescribing the rectangular aperture of the variable blind 45 are set by a drive section 52. The operation and timing of these drive sections 50, 51, and 52 are synthetically controlled by a CPU 53 provided in the unit control board 210 of the control rack CRB. The CPU 53 is connected to the minicomputer 202 shown in FIG. 1 through a bus $S_{bs}$.

Now, the values of the edge positions XL, XR, YU, and YD of the four sides of the rectangular aperture of the variable blind 45 are input from the keyboard of the OPD 206 by the operator to the minicomputer 202. The value of each edge position is set as a distance from the center of the reticle R, that is, the optical axis Ax of the projection lens PL (or the optical illumination system), and the minimum set unit is, for example, 0.1 mm on the reticle.

Figure 4:
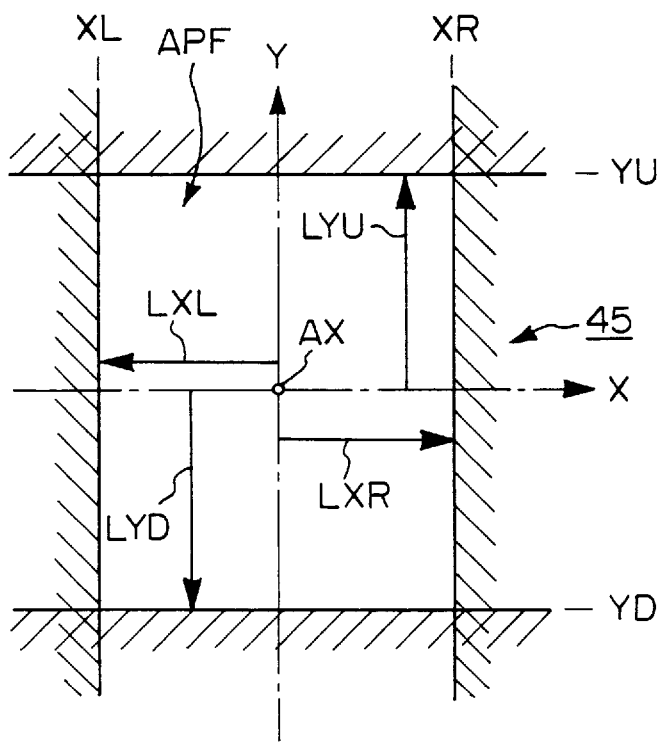
FIG. 4 shows, on a reticle, the positional relationship between the projected images of four edges which describe the rectangular aperture of a variable blind disposed in the illumination system of FIG. 3.

FIG. 4 illustrates, on the reticle, the positional relationship between the projected images of the four side edges which describe the rectangular aperture APF of the variable blind 45. In the two edges of the rectangular shape parallel to the Y axis of the orthogonal coordinates X and Y which matches the two-dimensional movement of the wafer stage WST, the left edge is set at a position XL spaced from the center line (Y axis) by a distance LXL, and the right edge is set at a position XR spaced from the Y axis by a distance LXR. Furthermore, in the two edges parallel to the X axis of the orthogonal coordinates X and Y, the upper edge is set at a position YU spaced from the X axis by a distance LYU, and the lower edge is set at a position YD spaced from the X axis by a distance LYD.

Incidentally, the pattern region or area of the reticle R for ordinal semiconductor devices is usually surrounded by a light shading band of at least about 1 mm width and so the projected image on the reticle of each edge of the rectangular aperture of the variable blind 45 must be projected within the width of the light shading band.

Then, in this embodiment a test reticle TR used for confirming the set position accuracy of the aperture edges of the variable blind 45 is accommodated into the reticle library 110 of the main assembly EXB of the exposure apparatus shown in FIG. 1. This test reticle TR is positioned with respect to the optical axis AX of the projection lens PL by the reticle alignment system RAS. Then, the pattern on the test reticle is illuminated by the illumination system 104 so that it is projected and transferred onto the wafer W in the same exposure sequence as a normal reticle R for semiconductor devices.

Figure 5:
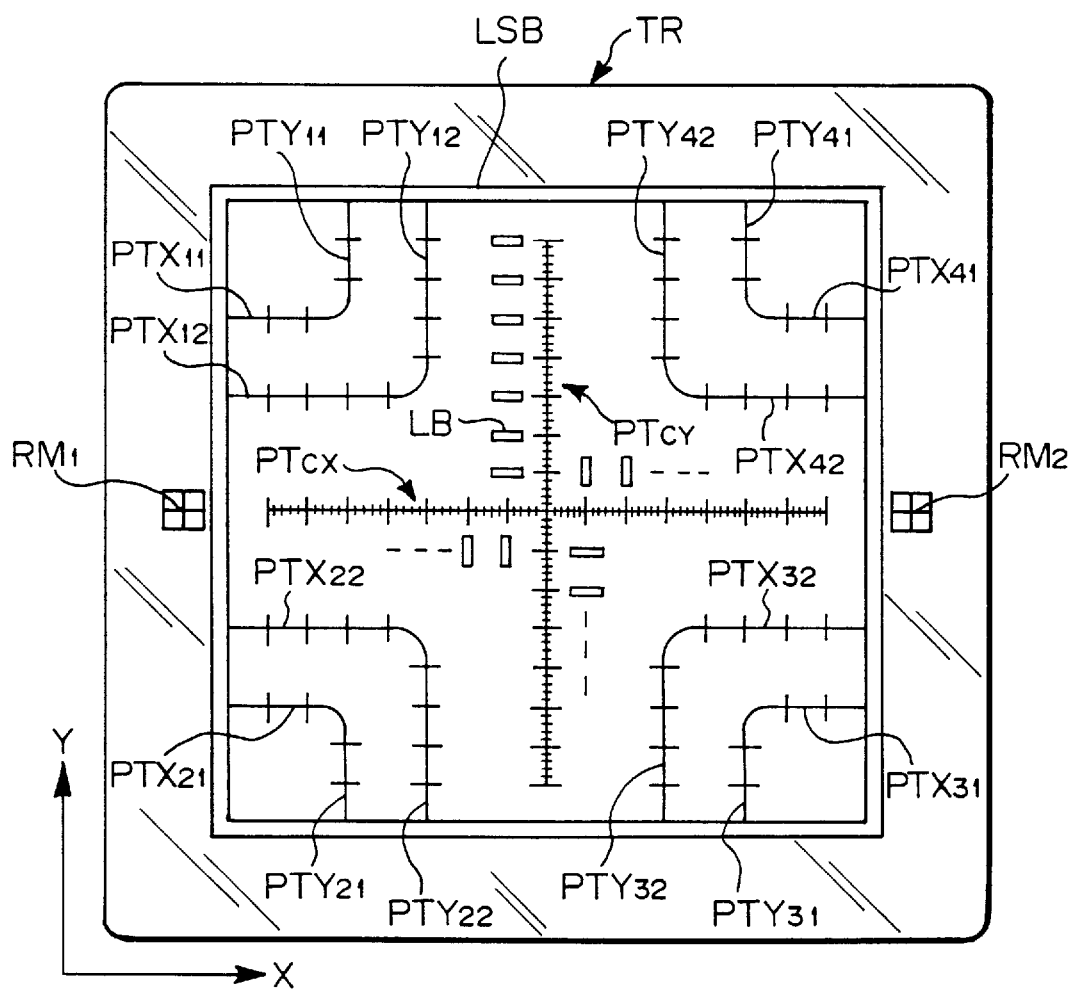
FIG. 5 is a plane view showing an example of the pattern arrangement of a test reticle TR according to the present invention.

FIG. 5 is a plane view showing an example of the pattern arrangement of the test reticle TR. Reticle alignment marks RM1 and RM2 which are detected by the reticle alignment system RAS are formed outside a light shading band LSB surrounding a rectangular pattern area in the X direction. The sizes in the X and Y directions of the rectangular pattern area are determined to be nearly equal to or slightly less than the diameter of the circular visual field of projection of the projection lens PL, and the pattern area is surrounded in the form of a rectangle by the light shading band LSB with a predetermined width.

At predetermined positions of the rectangular pattern region or area, a plurality of scale patterns are formed by etching and patterning a chrome layer. The scale pattern itself is formed as the shading portion of the chrome layer which is transparent, but, conversely it may be formed as a transparent portion in the shading portion of the chrome layer.

The scale patterns are constituted by scales $PT_{CX}$ and $PT_{CY}$ extending in the X and Y directions so that they cross each other at the reticle center (the optical axis AX of the projection lens PL) and scales $PTX_{nm}$ and $PTY_{nm}$ (where n=1, 2, 3, and 4, and m=1, 2) extending in the X and Y directions in the vicinity of each corner in the rectangular pattern area. The scales $PT_{CX}$, $PT_{CY}$, $PTX_{nm}$, and $PTY_{nm}$ have graduations representative of a dimension in the direction where the scale extends and numerical characters LB for visually reading out the dimension.

The graduations of each scale are set so that they represent real dimensions (in millimeter or inch) when projected on the wafer W. Furthermore, the numerical characters LB provided together with graduations are written so that they represent distances from the center of the reticle in correspondence with the set positions XL, XR, YU, and YD of the aperture edges of the variable blind 45.

One feature in the aforementioned lithography system is that the test reticle TR used for confirming the precision of the set positions of the variable blind of the main assembly EXB of the exposure apparatus is also used for confirming the precision of the width of the exposure of the peripheral edge of the wafer (peripheral exposer). A test exposure task program for such confirmation of the precision of the width of the peripheral exposure is stored in a hard-disk memory connected to the minicomputer 202 of the control rack CRB of FIG. 1. Therefore, the operator displays a list of utility software programs of the lithographic equipment on the display 204 by operation of the OPD 206 and then selects a test exposure task from the list for execution.

The test exposure task will hereinafter be described. This embodiment is constructed such that one mode can be arbitrarily specified from three modes; test exposure mode 1 for only confirmation of precision of the setting of the variable blind, test exposure mode 2 for only confirmation of precision of the width of the peripheral exposure, and test exposure mode 3 for executing both the test exposure modes 1 and 2. In the following operational example, only the mode 3 will be described.

Figure 6:
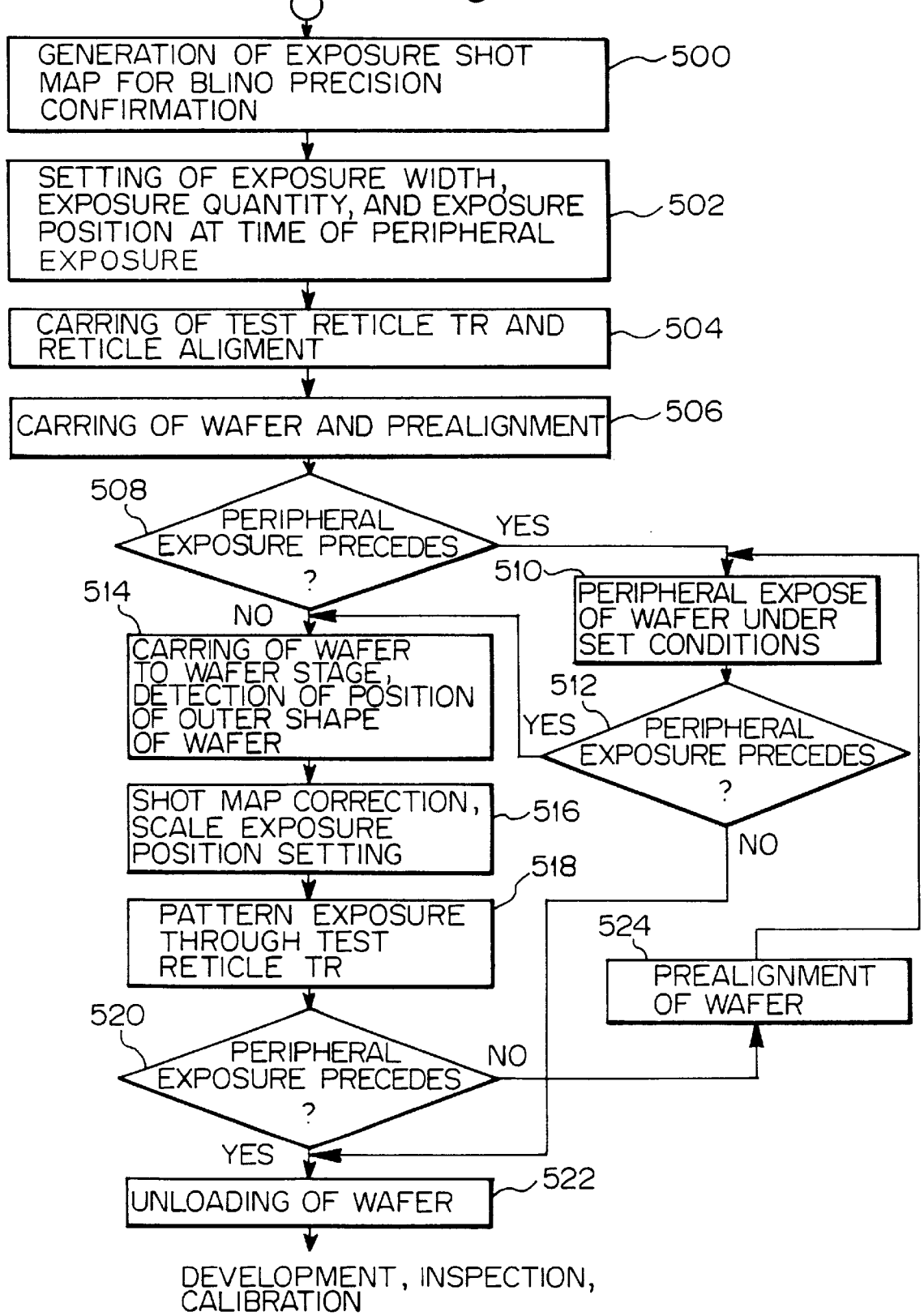
FIG. 6 is a flowchart showing an example of the test exposure mode according to the present invention.

FIG. 6 shows a flowchart of the test exposure mode 3. After mode 3 is started, in step 500 the minicomputer 202 generates a shot map which accepts the setting of various kinds of parameters, such as a plurality of shot coordinate positions, a quantity of exposure, and edge positions (XL, XR, YU, and YD) of the variable blind, which are exposed for confirmation of the position precision of the variable blind. The operator sequentially sets the parameters in an interactive manner through the keyboard of the OPD 206, while confirming the display 204.

In the next step 502 the minicomputer 202 is in a state of accepting the setting of various parameters as to exposure width, exposure quantity, and exposure position needed for peripheral exposure. Then, the operator sequentially sets the parameters in an interactive manner through the keyboard of the OPD 206, while confirming the display 204.

In the next step 504 the minicomputer 202 outputs a command to each control unit so that the test reticle TR is taken out from the library 110, is checked for foreign substances at the inspecting units 112 and 116 as needed, and then is carried onto the reticle stage provided above the projection lens PL. The test reticle TR placed on the reticle stage is positioned by the alignment system RAS so that the marks RM1 and RM2 are held at predetermined positions (reticle alignment).

Next, in step 506 the minicomputer 202 outputs a command so that a sheet of wafer W is carried up to the prealignment section 128 by the wafer carrier system 122. At the prealignment section 128, the wafer W is prealigned so that the rotational center of the turn table 10 and the geometrical center of the wafer W match each other, and the wafer W is held on the turn table 10 by vacuum suction.

In the prealignment section 128, the wafer W is rotated and positioned so that the flat portion and notch of the wafer W are oriented in a predetermined direction. The rotational position at which the wafer W is positioned is detected by a rotary encoder (not shown) provided in the turn table 10 and is stored in the CPU 30.

Incidentally, when peripheral exposure is performed, it can be selected in advance whether the peripheral exposure of a sheet of wafer precedes, or whether the pattern exposure of the reticle precedes. The minicomputer 202 executes the judgment made in step 508 in accordance with the specified selection. If it is now set that peripheral exposure precedes, in step 510 the minicomputer 202 executes the peripheral exposure of the wafer W on the prealignment section 128 in accordance with the parameters set in the aforementioned step 502.

Figure 7:
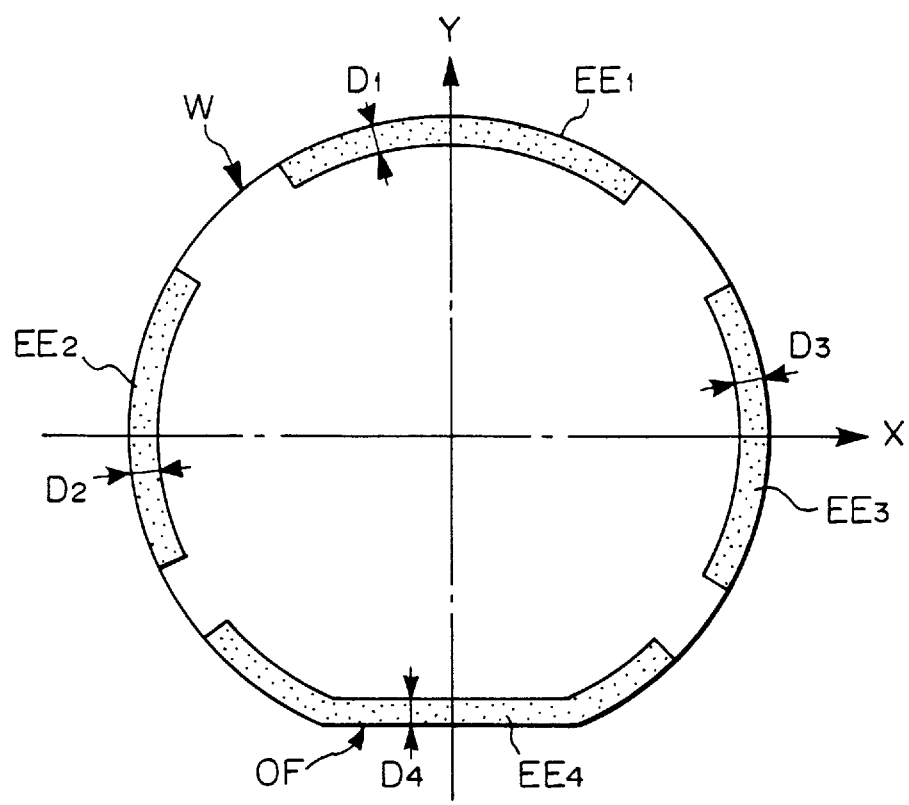
FIG. 7 is a diagram showing an example of peripheral exposure executed on the peripheral portion of a wafer W.

With the execution of the peripheral exposure, the wafer W is exposed, as an example, at four peripheral exposure regions EE1, EE2, EE3, and EE4, as in FIG. 7. When, in FIG. 7, a coordinate system XY is set with the center of the wafer W as an original point and the X axis is made parallel to the straight flat portion OF of the wafer W, the peripheral exposure region EE1 is set in a range such that it intersects the Y axis at the circular arc portion opposite the flat portion OF. The peripheral exposure regions EE2 and EE3 are set in a range such that they intersect the X axis at mutually opposite circular arc portions of the wafer W. Finally, the peripheral exposure region EE4 is set in the flat portion OF and circular arc portions extending from the opposite sides of the flat portion OF.

Also, the respective exposure widths D1, D2, D3, and D4 of the four peripheral exposure regions EE1, EE2, EE3, and EE4 in this embodiment are set to mutually different values. Notice that, in order for part of the entire peripheral region not to be exposed as in FIG. 7, the exposure light incident on the optical fiber 21 shown in FIG. 2 is temporarily shuttered by means of shutter and the like. Such control is also executed by the CPU 30 in accordance with set parameters of the peripheral edge exposure apparatus.

If the peripheral exposure ends in the aforementioned way, the minicomputer 202 will judge, in step 512 of FIG. 6, whether peripheral exposure has been executed precedently. If it is now assumed that the precedent execution of peripheral exposure has been set, in step 514 the minicomputer 202 output a command to a control unit (control board 210) so that the wafer W is carried from the prealignment section 128 onto the wafer stage WST by the load-unload mechanism 130. With this, the wafer W is positioned with an accuracy of about ±30 μm and is held on the wafer stage WST by suction.

Furthermore, in step 514 the minicomputer 202 executes a sequential operation for detecting the position of the external form of the wafer. The sequential operation is executed by any one of the reticle alignment system RAS, the TTL alignment system TLAS, and the off-access alignment system OFAS, where magnification of observation is relatively small and visual observation is possible, among alignment systems capable of detecting the marks on the wafer stage WST (the marks on the wafer, or the reference marks on the fiducial plate).

Also, the aforementioned sequential operation can automatically be performed by the aforementioned alignment systems, but, in this embodiment, the operation is executed with the assistance of an operator by the off-access alignment system OFAS.

For that reason, the minicomputer 202 outputs a command to the control board 210 for positioning the wafer stage WST so that three to five places of the peripheral edge of the wafer W are sequentially positioned within the visual field of detection of the alignment system OFAS. The peripheral edges of the wafer, which are detected by the alignment system OFAS, are two places separated on the flat portion OF of the wafer, two circular arc portions of the wafer intersecting the X axis in FIG. 7, and one circular arc portion of the wafer intersecting the Y axis.

If each peripheral edge is disposed within the visual field of detection of the alignment system OFAS, the operator, while viewing the image of the peripheral edge displayed on the display 204, slightly moves the wafer stage WST by operating the joysticks of the OPD 206 so that the peripheral edge is accurately positioned in the center of the screen in the X or Y direction. The coordinate positions of the wafer stage WST positioned are read from the interferometer 120 and are sequentially stored in the minicomputer 202 (or the stage control CPU).

Thereafter, in step 516 the minicomputer 202 amends the shot map generated in the aforementioned step 500 as needed, based on the stored coordinate positions in the X and Y directions of each peripheral edge, and also determines the coordinate positions of the wafer stage WST so that a specific scale pattern on the test reticle TR is exposed and transferred to a predetermined peripheral edge of the wafer W. In this embodiment, scale patterns are set so that they are exposed and transferred on the wafer in the directions which intersect the five places of the peripheral edge of the wafer detected by the alignment system OFAS.

Next, in step 518 the minicomputer 202 outputs a command such that, at the plurality of shot positions on the wafer W specified for confirmation of the set accuracy of the variable blind, the scale patterns on the test reticle TR are sequentially exposed and transferred under the conditions set in the aforementioned step 500. With this, latent images of shot regions or areas $S_b$ and $S_b$ such as those shown in FIGS. 8A and 8B, for example, are formed on the wafer W.

In FIG. 8 the shot area $S_a$ is obtained by setting and exposing each aperture edge of the variable blind 45 slightly inside of the shading band LSB of the test reticle TR shown in FIG. 5, and the shot area $S_b$ is obtained by setting and exposing each aperture edge of the variable blind 45 inside of the case of the shot area $S_a$ by a predetermined quantity.

Furthermore, the minicomputer 202 outputs a command which causes the wafer stage WST to be moved so that the center of the test reticle TR is sequentially positioned at the five places on the peripheral edge determined in the aforementioned step 516, as shown in FIG. 9. The center of the test reticle TR is exposed each time it is positioned in this way.

When the aforementioned positioning is performed, the positions XL, XR, YU, and YD of the aperture edge of the variable blind 45 are set to values sufficiently larger than the maximum value of the peripheral exposure widths D1 through D4. Important to the positioning is that the projected point $C_t$ of the intersecting point between the scale $PT_{CX}$ or $PT_{CY}$ of FIG. 5 and each peripheral edge is aligned with each peripheral edge with a necessary accuracy, because the scale $PT_{CX}$ or $PT_{CY}$ is used for confirming accuracy of peripheral exposure width.

As described above, the plurality of shot areas for confirmation of the set accuracy of the variable blind and the scale patterns for confirmation of peripheral exposure width are formed on the wafer W so that they do not overlap each other, and the peripheral portion of the wafer W is uniformly exposed in a state such as FIG. 7.

Thereafter, in step 520 the minicomputer judges whether or not the wafer W has been exposed precedently. If the wafer W has been exposed precedently, in step 522 the unloading of the wafer w is executed. With this, the wafer W on the wafer stage WST is returned to a specified wafer carrier through the load-unload mechanism 130 and the wafer carrier system 122. With this return, a sequence of operations in a case where the peripheral exposure in the test exposure mode 3 precedes are completed.

On the other hand, in the case of post peripheral exposure where peripheral exposure is performed after pattern exposure, the exposure of the test reticle TR in steps 514 through 518 is executed immediately after the aforementioned step 508. After post peripheral exposure is judged in step 520, the minicomputer 202 executes step 524. In step 524, the pattern-exposed wafer W on the wafer stage WST is returned to the prealignment section 128 by the load-unload mechanism 130, and as with step 506, the wafer W is centered and is held on the turn table 10 by vacuum suction.

Thereafter, the peripheral exposure of the wafer is performed in step 510. After post peripheral exposure is judged in step 512, step 522 is executed, and a sequence of operations in the case of the post peripheral exposure in the test exposure mode 3 are completed.

The wafer W exposed in the test exposure mode 3 is developed by a developing equipment and sent to an inspection process. In the inspection process, the operator views the resist image on the wafer surface by another viewing equipment (optical microscope, etc.), and the remaining image of the graduations of the scale pattern of each part transferred is read out. Alternatively, the developed wafer W may be again placed on the wafer stage WST of the main assembly EXB of the exposure apparatus in the prealigned state and the remaining image of the graduations of the scale pattern of each part transferred may be viewed by the alignment system OFAS, etc.

Figure 10A:
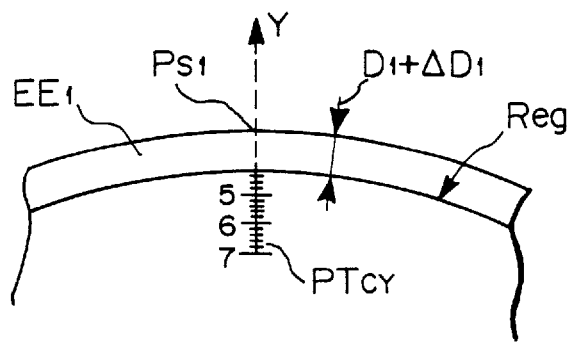
FIGS. 10A and 10B are diagrams showing an example of the resist image of a scale pattern formed on the wafer edge portion, respectively.
Figure 10B:
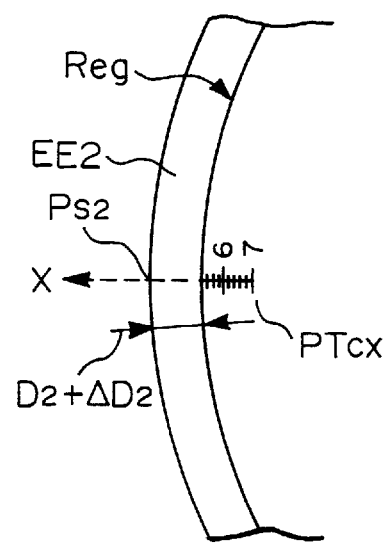

FIGS. 10A and 10B illustrate an example of the resist image of the graduations of the scale pattern formed in the peripheral portion of the wafer. More specifically, FIG. 10A illustrates the resist image of the scale $PT_{CY}$ formed on the circular arc portion EE1 of the wafer W shown in FIG. 7 in correspondence with the Y axis, while FIG. 10b illustrates the resist image of the scale $PT_{CX}$ formed on the circular arc portion EE2 of the wafer W shown in FIG. 7 in correspondence with the X axis.

In FIGS. 10A and 10B, the position $P_{s1}$, on the peripheral edge of the wafer corresponds to the original point of the scale $PT_{CY}$ and the position $P_{s2}$ on the peripheral edge of the wafer corresponds to the original point of the scale $PT_{CX}$. The space between the edge $R_{eg}$ of the resist layer removed by development after peripheral exposure and each peripheral edge, that is, an actual exposure width becomes $D1+\Delta D1$ for the region EE1 and $D2+\Delta D2$ for the region EE2. $\Delta D1$ and $\Delta D2$ are errors which result from the tracking characteristic due to the peripheral edge exposure apparatus.

Then, the operator reads the values of the graduations corresponding to the resist edges $R_{eg}$ from the resist images on the scales $PT_{CY}$ and $PT_{CX}$. The values of the graduations represent actual exposure widths $D1+\Delta D1$ and $D2+\Delta D2$, respectively. Assume now that the set value of the exposure width D1 with respect to the region EE1 is 4 mm. If the actual exposure width read from the scale $PT_{CY}$ is 4.3 mm, a quantity of error $\Delta D1$ is 0.3 mm and a quantity of tracking offset $\Delta D1/D1$ becomes 7.5%.

Also, the set value of the exposure width D2 with respect to the region EE2 is assumed to be 5 mm. If the actual exposure width read from the scale $PT_{CX}$ is 5.4 mm, a quantity of error $\Delta D2$ is 0.4 mm and a quantity of tracking offset $\Delta D2/D2$ becomes 8.0%.

The same operation is performed also for the other regions EE3 and EE4 to obtain quantities of error and quantities of tracking offset. By calculating the average value of the obtained values, a steady-state tracking offset quantity is determined. With this, a correction value for correcting a quantity of error between the exposure width specified by the operator and an actual exposure width is determined. The operator registers the correction value in the minicomputer 202 through the keyboard of the OPD 206.

With the aforementioned registration, if the exposure width of the peripheral exposure thereafter is set by the operator, the minicomputer 202 amends the exposure width by the quantity of the correction value and sends the amended value to the CPU 30 as a true target exposure width.

With a sequence of operations described above, the accuracy confirmation of the exposure width at the time of peripheral exposure and the calibration of the steady-state error at the time of tracking servo will end. Of course, by viewing the resist images of the shot areas $S_a$ and $S_b$ exposed as in FIGS. 8A and 8b and reading the graduations of the scales $PTX_{nm}$ and $PTY_{nm}$ or the graduations of the scales $PT_{CX}$ and $PT_{CY}$, the set accuracy of the four aperture edges of the variable blind is confirmed, and when necessary, the minicomputer 202 instructs the CPU 53 (see FIG. 3), which drives and controls the variable blind 45, to correct a quantity of control error.

Figure 11:
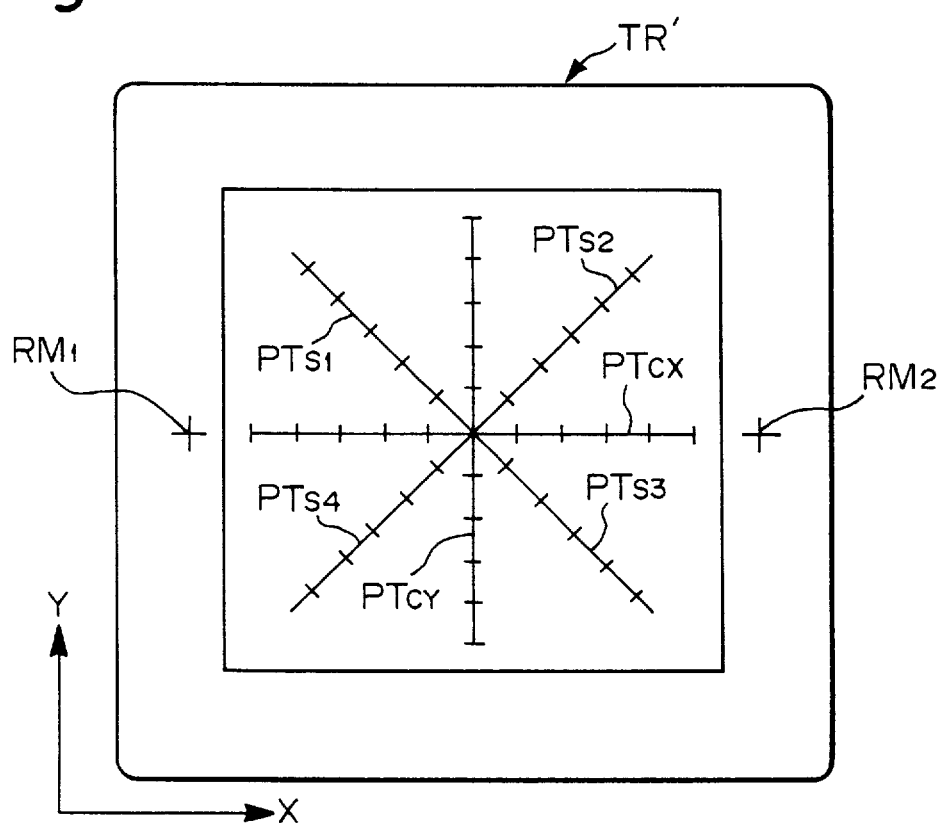
FIG. 11 is a diagram showing another example of the pattern arrangement of the test reticle.

A second embodiment of the present invention will next be described in reference to FIGS. 11 and 12. In this embodiment, a test reticle TR' is prepared where scales $PT_{s1}$, $PT_{s2}$, $PT_{s3}$, and $PT_{s4}$ extending from the center of the reticle at an angle of 45° or 135° relative to X and Y axes are formed in addition to scales $PT_{CX}$ and $PT_{CY}$ passing through the center of the reticle, as shown in FIG. 11.

Figure 12:
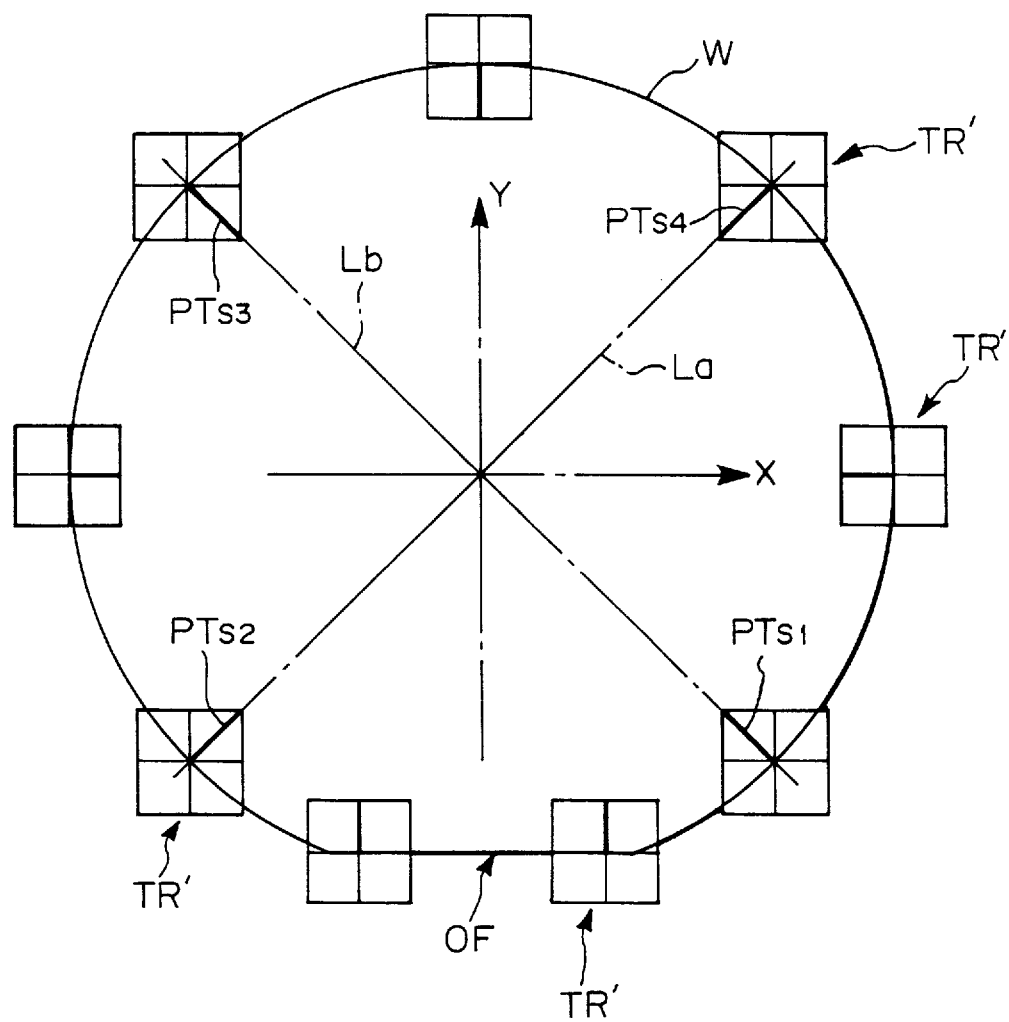
FIG. 12 is a diagram showing the position on the wafer W which is exposed with the pattern image of the test reticle of FIG. 11.

In exposing scale patterns in the aforementioned step 518 by using the test reticle TR', the wafer stage WST is sequentially positioned so that the center point of the test reticle TR' is projected on each intersecting point between each of lines $L_a$ and $L_b$, passing through the center of the wafer W and inclined at an angle of 45° or 135°, and the circular arc end of the margin of the wafer W, as shown in FIG. 12.

If done in the aforementioned way, it becomes possible to confirm the exposure widths in the directions of 45°, 135°, 225°, and 315° in addition to the exposure widths in the X and Y directions of the peripheral portion of the wafer W. Therefore, accuracy of the exposure width at the time of the peripheral exposure of the wafer can be confirmed in greater detail over approximately the entire circumference of the wafer, and stability in tracking accuracy (the deviation in accuracy in correspondence with peripheral positions) can be grasped.

While in each embodiment of the present invention the scale patterns have been formed within the test reticle TR, they may be formed on and along each side of the rectangular pattern region of the reticle R for semiconductor devices. And, when test exposure is performed to inspect peripheral exposure width, the scale patterns can be selected and exposed by the variable blind 45.

In addition, while in each embodiment of the present invention the confirmation of the peripheral exposure width has been performed after development of the photosensitive substrate, the same inspection is possible even by viewing the latent images formed on the resist layer before development. However, there are some cases where the width obtained by viewing the latent image as it is and the width of the resist layer of the peripheral portion removed by development do not always correspond to each other and so it is preferable that the exposure width be inspected after the substrate is developed in the same condition as when a device is manufactured.

Incidentally, in the aforementioned sequential operation shown in FIG. 6, in step 514 the position of the outer edge of the wafer has been detected by the alignment systems. However, when accuracy of the prealignment in the prealignment section 128 is sufficiently high or a re-prealignment mechanism is provided on the wafer stage WST, step 514 can also be omitted.

Incidentally, projection exposure apparatus with an excimer laser as a light source have recently been put into practice to resolve a pattern of line width of less than 0.3 $\mu$m. A KrF excimer laser which radiates ultraviolet light of the order of wavelength 248 nm, or an ArF excimer laser which radiates ultraviolet light of the order of wavelength 193 nm is known as an excimer laser beam source. Among these apparatuses, particularly the full-scale utilization of the projection exposure apparatus with an ArF excimer laser as exposure light is considered to be a few years later in development.

Also, in a case where exposure light whose wavelength is less than 200 nm is used as in the ArF excimer laser, a special resist with a sufficient temperature distribution in a range of the wavelength is utilized. Furthermore, the exposure light of wavelength of less than 200 nm reacts oxygen in atmospheric air and causes ozone to occur. Also, because of the influence of oxygen, the surface of an optical element (mirrors, lenses, etc.) in an optical path is degraded. For that reason, in the equipment with a ArF excimer laser as exposure light, it is considered that air in all optical paths needs to be replaced with inactive gas such as nitrogen and helium.

When, under such background, the peripheral portion of a wafer to which patterns are transferred is exposed by the ArF excimer laser exposure apparatus, a peripheral edge exposure apparatus consisting of the same structure as prior art cannot always be utilized. The large cause is a problem of resist and a light source for peripheral exposure associated with the resist. The simplest solution is to supply some or all of laser beams from the excimer laser beam source prepared for pattern exposure of a projection exposure apparatus to the peripheral portion of a wafer which is exposed. However, if done in this way, the utilization of pulse (total pulse number which is given to processing of a sheet of wafer) of the excimer laser beam source will become worse, and the number of wafers capable of both pattern exposure processing and peripheral exposure processing will be reduced, resulting in a reduction in the throughput of the projection exposure apparatus itself.

Then, as one realistic form, a stand-alone peripheral edge exposure apparatus can be prepared separately from a projection exposure apparatus and an exclusive excimer laser beam source can be provided in the peripheral edge exposure apparatus. In such a case, the excimer laser beam source for peripheral exposure is independent of the excimer laser beam source for pattern exposure provided on the side of the projection exposure apparatus and so the various kinds of problems described above are eliminated.

Figure 13:
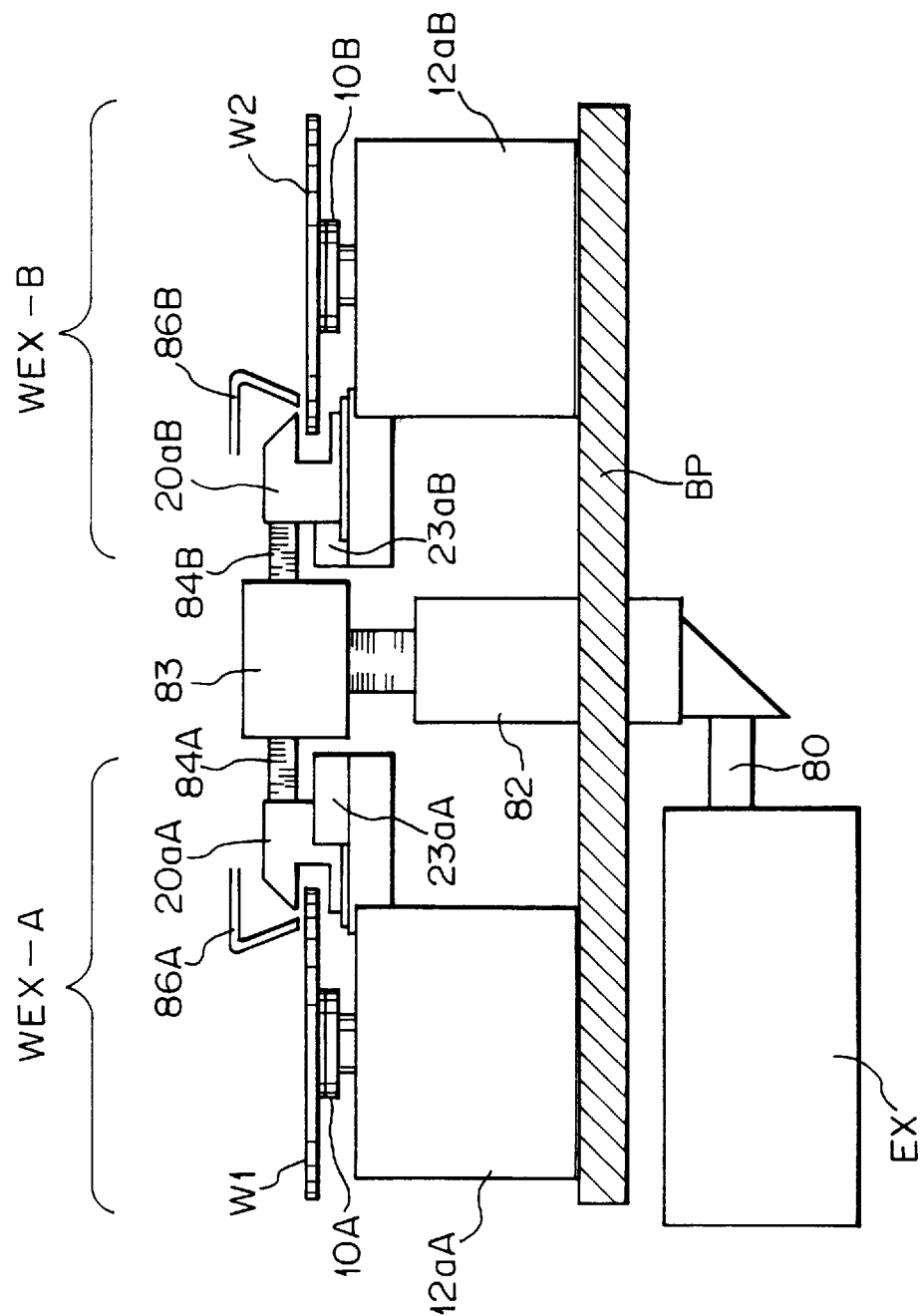
FIG. 13 is a diagram showing the structure of an peripheral edge exposure apparatus that uses a laser beam from an excimer laser beam source.

FIG. 13 shows an example of a stand-alone peripheral edge exposure apparatus in which an excimer laser beam source EX is mounted. In this example two peripheral edge exposure units WEX-A and WEX-B are integrally formed and provided on a base BP. The individual peripheral edge exposure units (peripheral exposure units) are identical in structure with that shown in FIG. 2, but there are some points of change associated with the fact that the excimer laser beam source EX is used as a light source.

The first point of change is that the positions of angles of rotation of turn tables 10A and 10B for rotating wafers W1 and W2 which are set in the peripheral edge exposure units are synchronized with the timing (trigger) of the pulsed laser beam of the excimer laser beam source EX, because the excimer laser beam source EX is a pulsed-beam source. The second point of change is that the greater part of the laser beam path leading from the excimer laser beam source EX to the wafers W1 and W2 is filled with nitrogen gas.

First, the pulsed laser beams from the excimer laser beam source EX are admitted through a tube 80 into an optical beam shaping system 82, in which the cross section of the beams is shaped, for example, into a rectangular and the intensity distribution in the beam cross section is made uniform. Then, the laser beams from the optical beam shaping system 82 are distributed into bellows-shaped shading cylinders 84A and 84B by a distributor 83 and are supplied to the exposure heads 20aA and 20aB of the peripheral edge exposure units WEX-A and WEX-B.

The exposure heads 20aA and 20aB are each provided integrally with light transmitting members for irradiating a laser beam to the peripheral portion of the wafer, such as an objective lens and a reflecting mirror, and a photoelectric detector for optically detecting the peripheral edge of the wafer. The exposure heads 20aA and 20aB are constructed such that they can be moved in the radial directions of the wafers W1 and W2 by drive mechanisms 23aA and 23aB for a tracking operation. The turn tables 10A and 10B having the wafers W1 and W2 held thereon by vacuum suction are controlled so as to rotate at approximately the same angular speed by rotational drive systems 12aA and 12aB.

With the aforementioned arrangement, the tube 80, the optical beam shaping system 82, the shading cylinders 84A and 84B, and the exposure heads 20aA and 20aB are all filled up with nitrogen gas, and nitrogen gas is also injected to exposed portions of the wafers W1 and W2 through pipes 86A and 86B.

In the aforementioned arrangement, an extinction filter and a high-speed shutter are incorporated into the distributor 83. The extinction filter individually adjusts the intensity of the laser beams which are supplied to the two exposure heads 20aA and 20aB, and the high speed shutter individually switches the shuttering and opening of the laser beams which are transmitted from the exposure heads 20aA and 20aB to the wafers W1 and W2.

Figure 14:
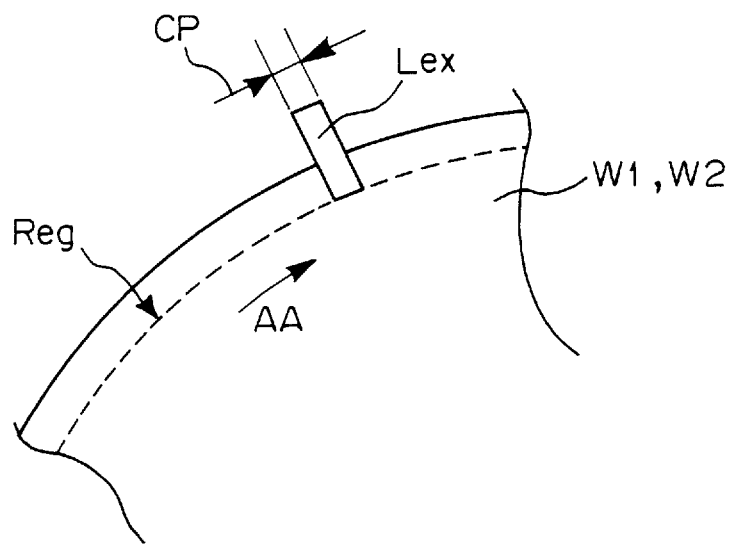
FIG. 14 is a diagram showing the positional relationship between an irradiated laser beam and a wafer by the equipment of FIG. 13.

Now, if the shape $L_{ex}$ of the laser beams, which are irradiated from the exposure heads 20aA and 20aB to the peripheral portion of the wafer, is assumed to be a rectangular which has a circumferential width of $C_p$ and extends in the radial direction of the wafer, as in FIG. 14, then predetermined conditions exist between a speed $V_s$ (mm/sec) along the circumferential direction of the wafer indicated by an arrow AA, a cycle $T_p$ (sec) of the pulsed laser beam, and a width $C_p$ (mm) in the relatively traveling direction of the laser beam.

More specifically, when the pulsed laser beam cycle $T_p$ is assumed to be constant (the oscillating frequency is assumed to be constant), it is necessary that at least a condition "$C_p/V_s \geq T_p$" is met as a condition for reliably realizing peripheral exposure. If the condition, $C_p/V_s \geq T_p$, is not met, a unexposed portion will occur in the resist layer of the peripheral portion of the wafer. Note that if the diameter of the wafer is taken to be $R_w$ (mm) and the rotational speed of the wafer is taken to be Q (rpm), the aforementioned condition is expressed as $(60C_p/Q \cdot \pi \cdot R_w) \geq T_p$ because $V_s = Q \cdot \pi \cdot R_w/60$.

Furthermore, to make a quantity of exposure, which is given to the resist of the peripheral portion of the wafer, approximately uniform, predetermined $N_p$ ($\geq 2$) pulses of the pulsed laser beam become necessary during the time the wafer edge moves in the circumferential direction by a quantity of the width $C_p$ of the laser beams $L_{ex}$. A larger number of pulses can achieve more uniform peripheral exposure. However, the number $N_p$ is set to about 2 to 10, because the peripheral exposure is, unlike a case of pattern exposure, sufficient if the resist layer can merely be removed.

Then, strictly set the aforementioned condition. The rotational speed Q or exposure width $C_p$ is adjusted so that a relation of $(60C_p/Q \cdot \pi \cdot R_w) = k \cdot N_p \cdot T_p$ (where k is an arbitrary integer) is met with a predetermined accuracy. Of course, it is not necessary to mention that the energy quantity of an excimer laser beam per pulse is also taken into consideration and, when necessary, the excimer laser beam is reduced to a predetermined quantity with an extinction filter.

Incidentally, when a pulsed beam from a single excimer laser beam source is distributed into two peripheral edge exposure units WEX-A and WEX-B such as those shown in FIG. 13, the oscillation of the pulsed beam is executed during the time the disjunction or logical add (OR) between the peripheral exposure edge start request signals of the two peripheral-exposure units WEX-A and WEX-B is established, and the start and end of each of the units WEX-A and WEX-B are controlled with each high-speed shutter provided in the beam splitter 83.

Although, in the aforementioned embodiment, the peripheral edge exposure apparatus has been assumed to have an excimer laser beam source for exclusive use, a low-pressure mercury lamp or Xe—Hg lamp which radiates continuous light can be likewise utilized if it radiates a ultraviolet ray of less than 250 nm wavelength. However, in such a case it is necessary to choose a light source where sufficient light intensity can be obtained in correspondence with the photosensitive wavelength characteristic of the resist film coated on the wafer.

In addition, the peripheral edge exposure apparatus of FIG. 13 can expose and process two sheets of wafers at the same time with two units WEX-A and WEX-B integrally formed. Therefore, for example, if two projection exposure apparatuses are connected with the peripheral edge exposure apparatus of FIG. 13 through an in-lined wafer carrier system, semiconductor devices can be produced with high efficiency without reducing the number of wafers that can be exposed per hour for a given processing performance (throughput).

Furthermore, a stand-alone peripheral edge exposure apparatus such as the one shown in FIG. 13 may be incorporated into a coater-developer (C/D), which coats photoresist on a wafer which is supplied to a projection exposure apparatus and develops the wafer after exposure.

In accordance with the aforementioned peripheral edge exposure method and lithography method of the embodiment of the present invention, it becomes possible to simply confirm accuracy of the exposure width of the portion exposed with the peripheral edge exposure apparatus without requiring an operator to touch a photosensitive substrate and also it becomes possible to calibrate the peripheral edge exposure apparatus in correspondence with the confirmed accuracy.

The exposure width from the peripheral edge or portion of a photosensitive substrate, such as a wafer, can be accurately inspected comparatively, and the positional relationship between the disposition of semiconductor patterns (shot areas) formed on the photosensitive substrate with an exposed peripheral edge and the boundary line of the exposed peripheral edge can be grasped accurately. Therefore, the number of shot areas, which are removed among the shot areas formed on the peripheral edge of a wafer by removing the photoresist of the wafer, can be accurately known in advance and so it becomes possible to administrate the yield of the number of chips that can be obtained.

Figure 15:
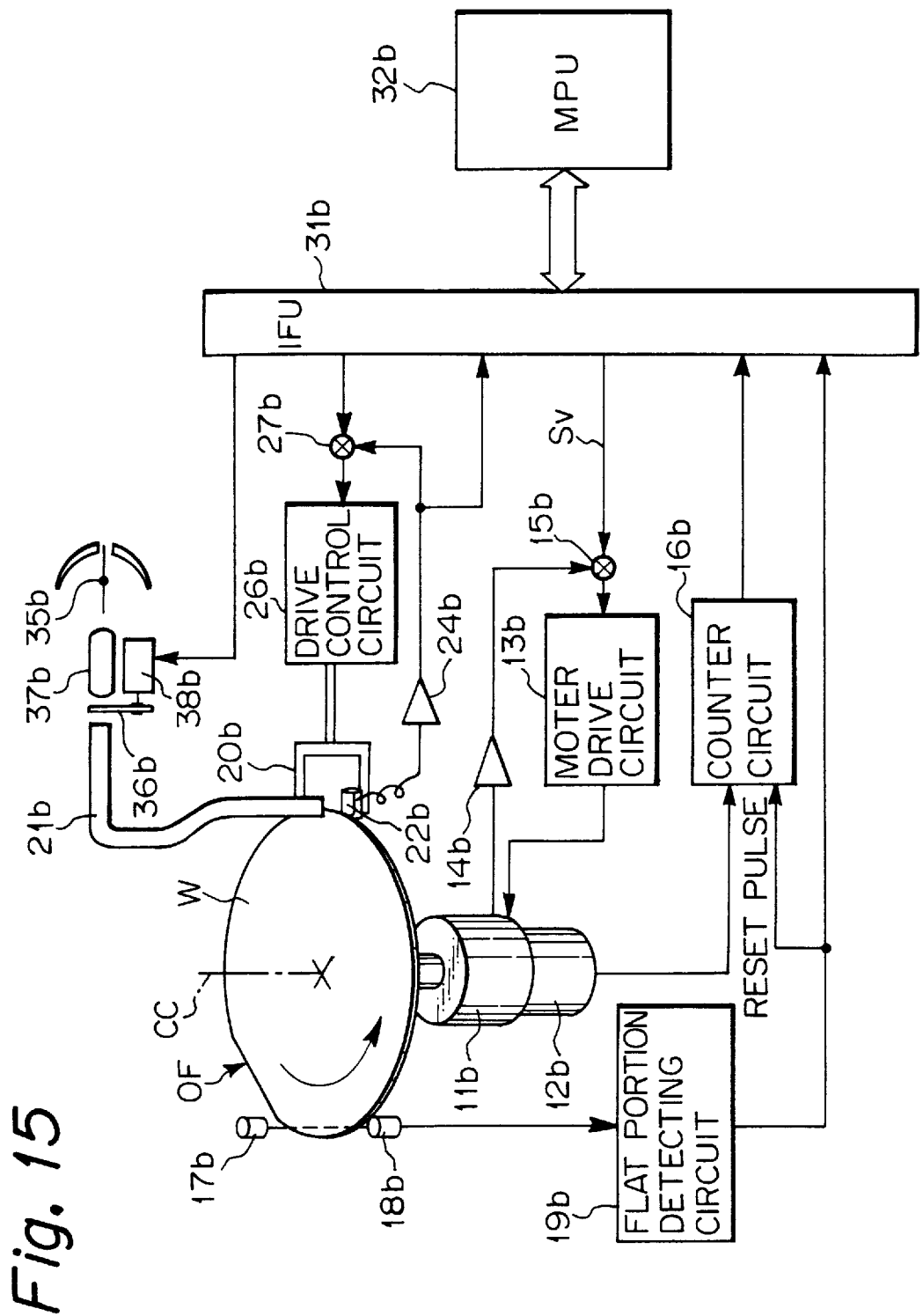
FIG. 15 is a block diagram showing another embodiment of the peripheral edge exposure apparatus of the present invention.

A description will next be made of still another embodiment of the peripheral edge exposure apparatus of the present invention. FIG. 15 diagrammatically shows the peripheral edge exposure apparatus of this embodiment.

In FIG. 15, a circular wafer W with an orientation flat (straight cutout) OF is held on a turn table, which is rotatable in a counterclockwise direction by a motor 11b with a tacho-generator. When the wafer W is held on the turn table, the center of the wafer W is held coaxially with the rotational axis CC of the motor 11b (turn table) and the wafer W is rotated on a plane parallel to the surface of the turn table without eccentricity. Also, the rotational shaft CC of the motor 11b is coupled to a rotary encoder 12b which detects the rotational angular position of the motor 11b with a resolution of, for example, less than 0.5°. The rotational speed of the motor 11b is controlled by feeding a speed signal from the tacho-generator back to a motor drive circuit through an amplifier 14b and a differential circuit 15b. The target speed of the motor 11b that is controlled is set with a speed command value $S_v$ from an interface unit (IFU) 31b. The IFU 31b interfaces with a main processing unit (MPU) 32b to exchange digital or analog signals between the MPU 32b and each signal system. Also, the up-down pulses from the encoder 12b are counted by a counter 16b, and the counted number is sent to the IFU 31b as an angular value. The counter 16b is constructed so that it is automatically reset when it counts the up-down pulses from the encoder 12b by a quantity of one revolution (360°) of the wafer.

Incidentally, the peripheral edge exposure section is provided with an optical system 37b, which focuses a light beam from a light source 35b to the entrance incident end of an optical fiber 21b through a shutter 36b. Opening and closing of the shutter 36b are performed by a motor 38b which is driven in response to a command from the IFU 30. The cross section of the emergent or emitting end of the optical fiber 21b is formed into a rectangular (slit) shape and is firmly attached to a movable arm or slider 20b. The slider 20b retains the emitting end of the optical fiber 21b so that the emitting end faces the surface of the peripheral portion of the wafer W, and one-dimensionally moves the emitting end of the optical fiber 21b in the radial direction with the rotational axis CC as a center. The slider 20b, although described later, is provided with a mechanism which can adjust the spacing between the emitting end of the optical fiber 21b and the wafer W. At a position opposite to the emitting end of the optical fiber 21b across the peripheral portion or edge of the wafer W, there is disposed a photoelectric sensor 22b which detects some (or all) of exposure light beams being transmitted without being shaded by the peripheral portion. This photoelectric sensor 22b is fixed integrally to part of the slider 20b. A photoelectric signal from the photoelectric sensor 22b is supplied as a feedback signal to a drive control circuit 26b of the slider 20b through an amplifier 24b, a differential circuit 27b. A command signal with a level corresponding to the exposure width of the peripheral portion is applied from the IFU 31b to the differential circuit 27b, and the drive control circuit 26b servo-controls so that the command signal and a signal from the amplifier 24b become equal to each other.

Also, a light emitting diode 17b and a light receiving element 18b for detecting the flat portion OF of the wafer W are disposed in a facing relationship across the peripheral portion of the wafer W. A signal from the light receiving element 18b is processed by a flat-portion detecting circuit 19b, from which a signal that represents the moment when the center position of the flat portion OF corresponds to a spot light beam of the light emitting diode 18b is output to the IFU 31b. The light from the light emitting diode 17b is set to a red or ultraviolet ray that is non-sensitive with respect to the resist film of the wafer. Also, the spacing in the rotational direction of the wafer between a position on which a spot beam from the light emitting diode 17b is projected and the position of the emitting end of the optical fiber 21b is fixed on the equipment, so the spacing is stored in advance in the MPU 32b as a rotational angular quantity of the wafer W.

With the aforementioned arrangement, the timing at which the shutter 36b is opened or closed, the specification of the exposure width of the peripheral edge of the wafer, the rotational speed of the wafer W, etc., are controlled from the MPU 32b through the IFU 31b. In the case of peripheral exposure, the intensity, I, of exposure light from the optical fiber 21b is measured with the photoelectric sensor 22b, when there is no wafer. The value is stored in the MPU 32b through the IFU 31b. If it is assumed that an appropriate quantity of dose ($S_r$) for the resist layer on the wafer W is known beforehand, the MPU 32b calculates exposure time ($\Delta T$) from the circumferential dimension (D) in the peripheral direction of the wafer among the dimensions of the cross section of the exposure light from the optical fiber 21b. Notice that the measured intensity, I, is converted to a Joule unit.

First, from an appropriate dose quantity $S_r$ (mJ) and intensity, I (mJ), the exposure time $\Delta T$ (msec) needed during the time when the peripheral edge of the wafer moves in the circumferential direction by a dimension D is expressed as $S_r/I$. Therefore, if the wafer W is rotated at a speed faster than the exposure time, only one revolution of the wafer W will cause an insufficiency in the exposure quantity. The diameter L of the wafer W is fixed as a standard, so the outer circumferential length of the wafer W is $\pi L$ (mm). Therefore, in order for the dimension D (mm) to correspond to the exposure time $\Delta T$ (msec), the time T needed for the wafer W to make one revolution is given as follows:

$$T=(\pi L/D)\cdot \Delta T=(\pi L/D)\cdot(S_r/I)$$

From the foregoing, the rotational speed (1/T rpm) of the wafer W is obtained. The MPU 32b outputs a command value $S_v$ corresponding to the rotational speed to the differential circuit 15b through the IFU 31b. With this, the wafer W rotates at the commanded speed.

On the other hand, the MPU 32b reads the angular value of the counter 16b through the IFU 31b, outputs an opening command of the shutter 36b to a motor 38b at an arbitrary angular position (start position), and outputs a closing command of the shutter 36b to the motor 38b at a position where the wafer makes one revolution (360°) from the start position. During this, the servo system, which consists of the slider 20b, the photoelectric sensor 22b, the amplifier 24b, the differential circuit 27b, and the drive control circuit 26b, performs a tracking control so that the level of a signal from the photoelectric sensor 22b reaches a set value, that is, a constant peripheral exposure width (the radial dimension of the wafer). The operation of this tracking control is described in detail in Japanese Laid-Open Patent Publication No. Hei 2-56924 and so a further description is omitted.

Notice that the tracking control method may be a dummy tracking method disclosed, for example, in Japanese Laid-Open Patent Publication No. Hei 4-72614 in addition to that shown in FIG. 15. In the dummy tracking method, the tracking servo operation of the movable arm or slider 20b is performed with light in a range of non-photosensitive wavelength irradiated from the optical fiber 21b of FIG. 15 toward the edge of the wafer W. Each time the wafer W is rotated by a very small angle, the tracked position of the slider 20b is sequentially detected and stored with the linear encoder attached to the slider 20b. Thereafter, exposure light is irradiated from the optical fiber 21b, and in response to the data of the tracked position stored and the rotational angular position of the wafer W, the servo control of the slider 20b is performed, thereby performing principal exposure. An advantage of this method is that the shutter 36b can be freely opened and closed, because the photoelectric sensor 22b does not need to perform a tracking operation, while receiving exposure light. In other words, the advantage is that an arbitrary position can be set on the peripheral edge of the wafer W and the position can be exposed with a high degree of accuracy.

Also, the tracking control of the slider 20b shown in FIG. 15 is likewise made also for the flat portion OF of the wafer W.

Figure 16:
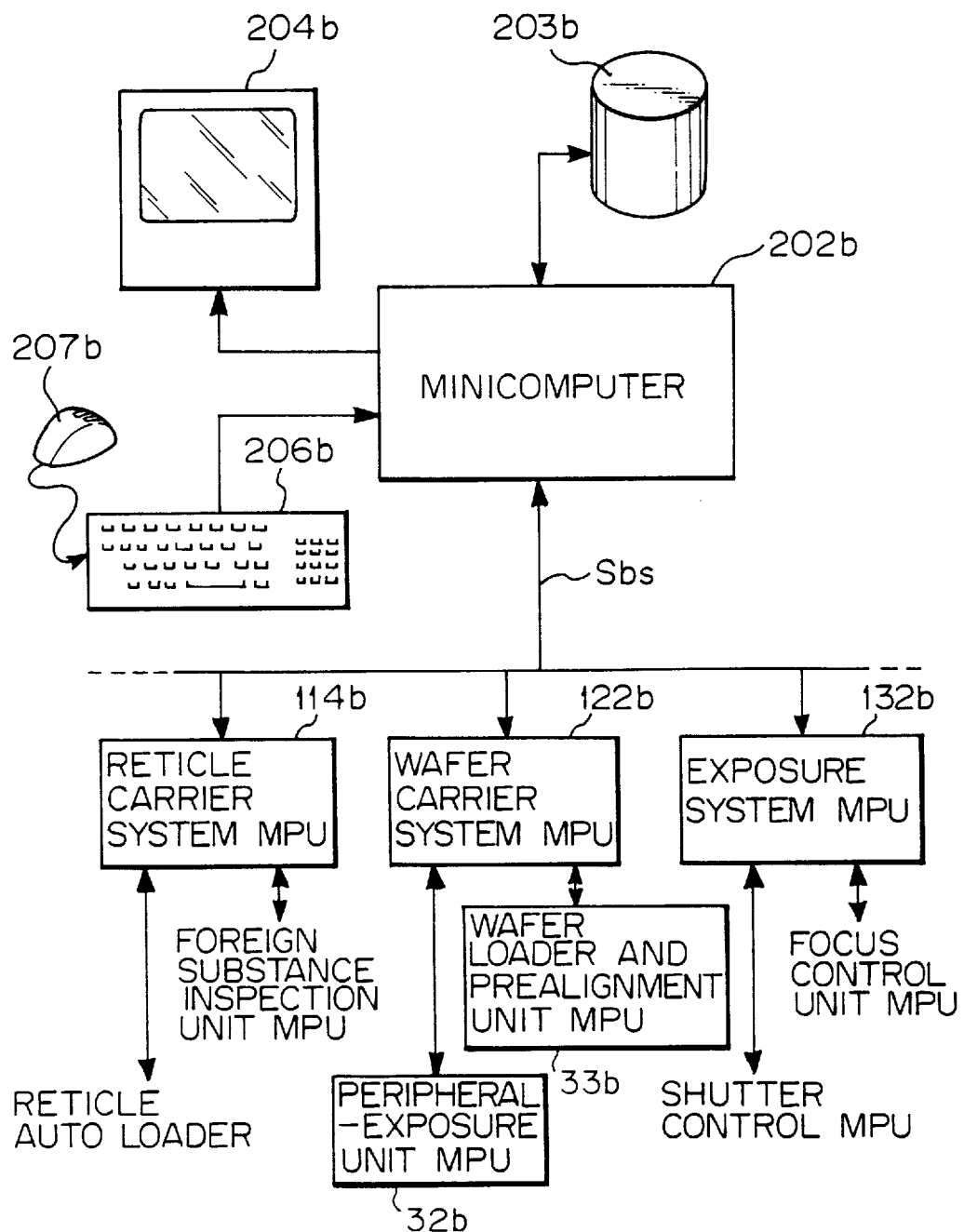
FIG. 16 is a block diagram showing a control system provided in a wafer stepper in a case where the peripheral edge exposure apparatus is mounted in the wafer stepper.

FIG. 16 shows a block diagram of a system which synthetically controls the peripheral edge exposure apparatus shown in FIG. 15. As an example, the system is constructed on the assumption that the peripheral edge exposure apparatus of FIG. 15 is provided in the wafer carrier of a semiconductor exposure apparatus (wafer stepper).

The semiconductor exposure apparatus is synthetically controlled by a minicomputer 202b (VAX corresponding model of DEC, for example), and the operational procedure and various kinds of parameters are stored in a program form or table form in a hard-disk memory 203b.

An input device to the minicomputer 202b is a keyboard 206b or a mouse 207b, and a terminal display unit is a CRT or liquid crystal display 204b. It is preferable that the display 204b can display with colors. Notice that the mouse 207b is provided with an exhaust tube so that the pressure in the mouse is slightly reduced, because there is the possibility that the mouse will raise dust as it is operated.

Various kinds of units in the wafer stepper, incidentally, are connected to the minicomputer 202b through a bus $S_{bs}$. However, in FIG. 16, three main units, a reticle carrier system 114b, a wafer carrier system 122b, and an exposure system 132b are shown as representative examples. These three main units are provided with MPUs (e.g., 16-bit class), respectively. Each MPU is constructed such that it controls a low rank subunit (concrete control system).

A reticle auto loader and a foreign-substance inspection unit (MPU) are provided as low rank subunits of the reticle carrier system 114b. The reticle auto loader automatically carries a reticle (original mask), which is used in projection exposure, from a predetermined hold position to an exposure position, and the inspection unit optically inspects the existence of particles (of less than 1 μm) on the reticle.

The peripheral edge exposure unit (MPU) 32b and the wafer loader and prealignment unit (MPU) 33b shown in FIG. 15 are provided as low rank subunits of the wafer carrier system 122b. A shutter control unit (MPU) and a focus control unit (MPU), which are operated at the time of step-and-repeat exposure, are provided as subunits of the exposure system 132b.

In the aforementioned system arrangement, when a wafer where the peripheral edge is exposed is processed with a stepper, an operator calls out data base (or a command file) for peripheral exposure from the hard-disk memory 203b to the minicomputer 202b through the keyboard 206b. Then, the minicomputer 202b sends primary commands and parameters to the wafer carrier system 122b through the bus $S_{bs}$ so that irradiation and exposure are performed in accordance with the data base. Furthermore, the wafer carrier system 122b expands the received primary commands and parameters to secondary (concrete) commands and parameters that the peripheral edge exposure unit (MPU) 32b can execute. In cooperation with the wafer loader and prealignment unit 32b, the wafer carrier system 122b performs a sequential control so that the execution of the secondary command and the setting of the secondary parameter are performed at predetermined timings.

Some of the primary commands and parameters are temporarily held in the memory of the minicomputer 202b and are displayed on the display 204b. Therefore, the operator can execute peripheral exposure under desired conditions by correcting or adding some of the primary commands and parameters as needed.

In addition to the aforementioned peripheral edge exposure program in normal mode, a test exposure program for determining optimum conditions at the time of peripheral exposure is stored in advance in the hard-disk memory 203b as a utility software program. The test exposure program forms the essential part of the operation of the first embodiment of the present invention, so it will hereinafter be described in detail.

In the case of normal peripheral edge exposure mode, previously set various kinds of parameters (particularly the rotational speed of the wafer, the intensity of the exposure light, etc.) do not change at all during the time a sheet of wafer is processed. However, the test exposure mode is programmed so that the parameters are automatically changed to various values during the time a sheet of wafer is processed.

Figure 17:
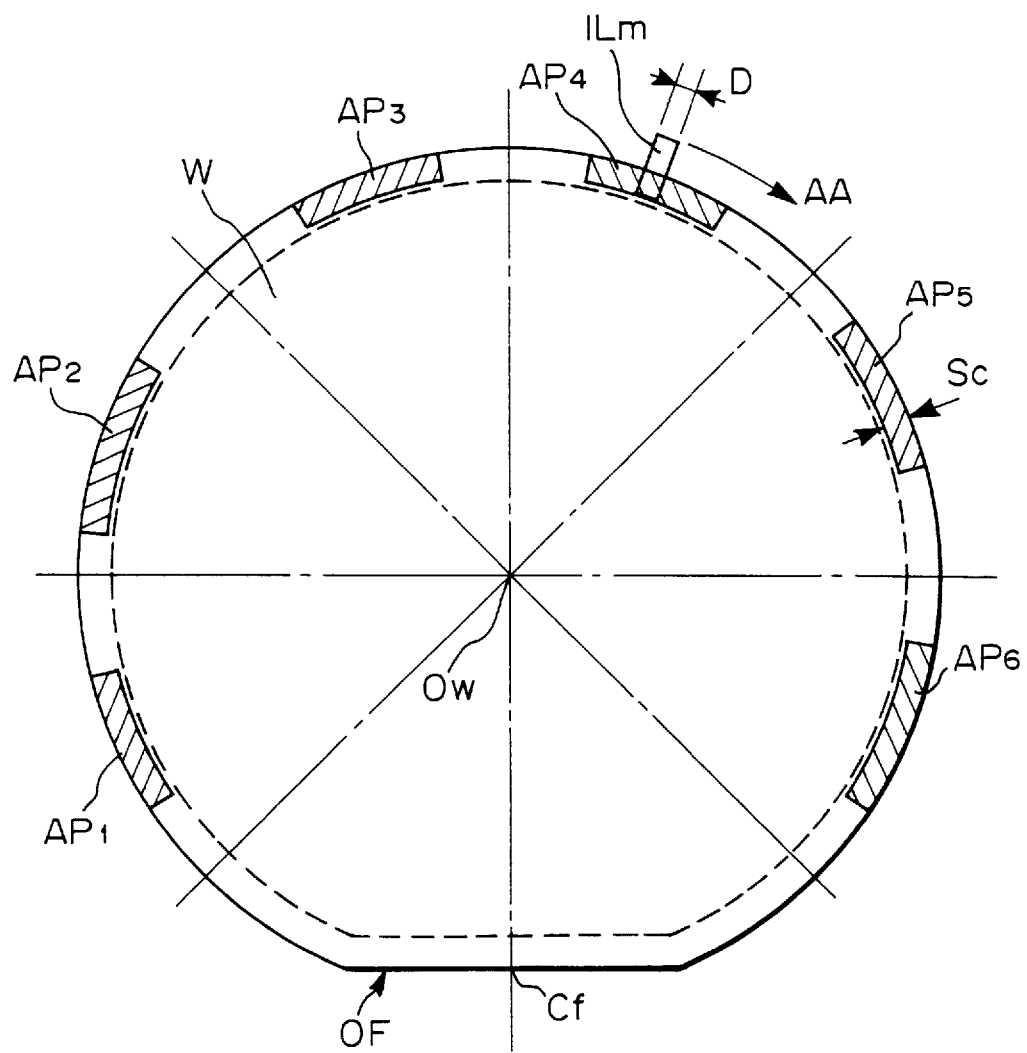
FIG. 17 is a diagram showing the state of the wafer which is processed with the test exposure of the peripheral edge exposure apparatus of FIG. 15.

More specifically, for example, the outer circumference of the wafer W is divided at suitable angles, as shown in FIG. 17, and peripheral exposure is performed by changing, for example, the rotational speed of the wafer W so that mutually different target exposure quantities are given to the divided exposure regions $AP_1$ through $AP_6$.

In FIG. 17, the outer circumference of the wafer W is divided into 8 equal parts along the circle having the center $O_w$ which is substantially equivalent to the center of the wafer W (nearly aligned with the rotational shaft CC of the motor), and the divided exposure regions $AP_1$ to $AP_6$ are set over suitable circumferential ranges of the 8 equally divided peripheral regions.

The peripheral region, shown by broken lines in FIG. 17, represents a region that is exposed at the time of normal mode with a rectangular light beam $IL_m$ with a width D from the emitting end of the optical fiber 21b.

The light beam $IL_m$, shown in FIG. 17, rotates relatively in the clockwise direction as shown by an arrow AA in FIG. 17, when the wafer W rotates in the counterclockwise direction as in FIG. 15.

It is assumed in this embodiment that the test exposure is not performed with respect to the divided regions which include the flat portion OF of the wafer W with the center position $C_f$ of the flat portion OF as a reference. Of course, the test exposure can be set so that the flat portion OF of the margin of the wafer is exposed. Furthermore, the radial exposure width $S_c$ of each of the divided exposure regions (hatched portions) $AP_1$ through $AP_6$ at the test exposure can be set, for example, to an arbitrary value between 2 mm and 10 mm, but it is not necessary to mention that the radial exposure width $S_c$ must be set within a range where photoelectric detection by the light receiving element 22b of FIG. 15 is stably performed, that is, a range shorter than the length of a rectangular light beam $IL_m$ in the radial direction of wafer.

Incidentally, if the operator instructs the minicomputer 202b to execute a program for test exposure, then the minicomputer 202b will make an inquiry to the operator about the conditions (parameters) for the test exposure. At this time, names of various kinds of parameters and the default values (previously set initial values or previous values) are displayed on the display 204b, and the operator changes or confirms the value of each parameter as needed. Representative parameters needed for test exposure are mainly a center target exposure quantity $CX_v$ (mJ), a deviation width of an exposure quantity, $\Delta V_x$ (mJ), and a step number N.

The step number N in the example of FIG. 17 corresponds to "6" of the 6 divided exposure regions $AP_1$ through $AP_6$. When N=0, test exposure itself is canceled. When N=1, the set deviation width $\Delta V_x$ is ignored and test exposure mode is shifted to normal exposure mode where the target exposure quantity $CX_v$ is used.

Now, if representative parameters are set and the operator instructs "EXECUTE" through keyboard 206b or mouse 207b, the minicomputer 202b performs judgment of correctness about some of the set parameters. The example will be described with a flowchart of FIG. 18.

Figure 18:
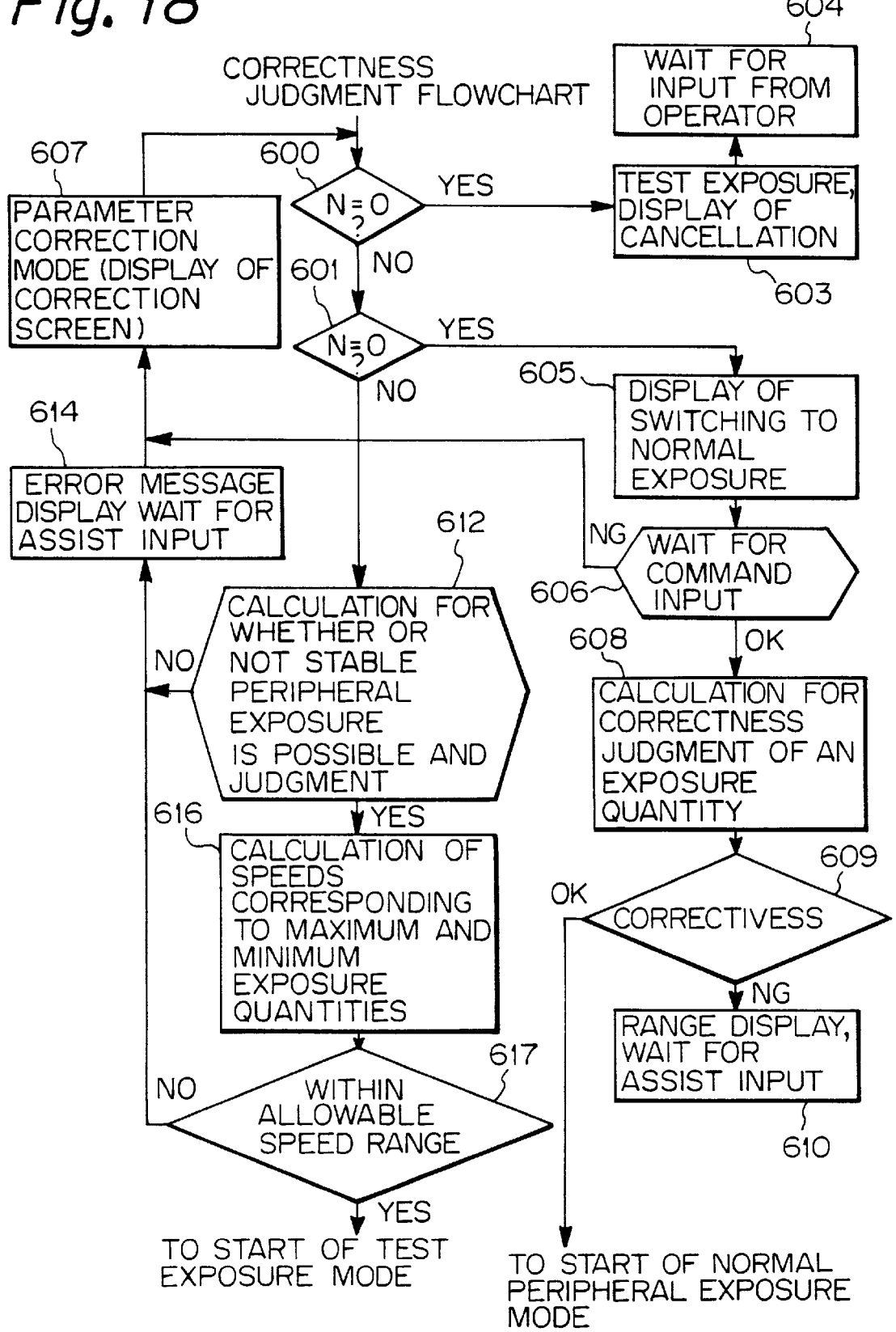
FIG. 18 is a flowchart of a program used for judging the correctness of various kinds of parameters which are input at the time of exposure of peripheral edge and at the time of test exposure.

FIG. 18 is a diagrammatic flowchart of correctness judgment. First, it is judged in steps 600 and 601 whether or not the step number N is zero or one. In the case of N=0, in step 603 the display to the effect that test exposure is canceled is performed by the display 204b, and in step 604 the minicomputer waits for the operator to inputting confirmation. In the case of N=1, in step 605 the display to the effect that mode is shifted to normal exposure mode is performed by the display 204b, and in step 606 the minicomputer 202b waits for the operator to inputting confirmation of parameters. If, on the other hand, in step 606 the operator inputs correction of parameters, in step 606 the minicomputer 202b displays a correction screen on the display 58 and waits for the operator to inputting confirmation or changes of parameters. The correction screen contains, in practice, the same contents as the screen where initial parameters are set.

If, on the other hand, in step 606 the operator inputs a command to the effect that normal exposure will do, in step 608 the minicomputer 202b makes a calculation for judging correctness of an exposure quantity. In this case, it is judged whether or not the control of the rotational speed of the wafer W is impossible in correspondence with the set center target exposure quantity $CX_v$. The judgment is made with the same calculation as the aforementioned opera expression used for calculating the time T required for one revolution of a wafer. That is, a value of $T=(\pi L/D) \cdot (CV_x/I)$ is calculated by using the intensity I, of a signal (that is, intensity of exposure light) previously detected by the photoelectric sensor 22b when there is no wafer, the width D of a rectangular light beam $IL_m$, the diameter L of wafer W and the target exposure quantity $CX_v$. When the calculated time T (time required for the wafer W to make one revolution) is a value greater than the maximum of the control rotational speeds of the turn table, the minicomputer 202b advances to NG at step 609 in step 610, the display 204b displays that the target exposure quantity $CX_v$ is over the range and how much percent the quantity is over, and waits for an assist input from the operator.

In the above case, the set target exposure quantity $CX_v$ is obtainable even when the wafer W is rotated at the maximum speed. Therefore, if the target exposure quantity $CX_v$ is sufficiently large with respect to an optimum dose quantity $S_r$ predicted in correspondence with the kind or thickness of the resist film of the wafer, removal of the resist film from the peripheral edge by peripheral exposure can be achieved as a temporary measure. However, when it is predicted that other problems (stability in the radial exposure width, etc.) associated with overexposure become conspicuous, correction of a parameter (exposure quantity $CX_v$) is made in the same way as the aforementioned step 607.

When, on the other hand, in step 609 the exposure quantity is judged to be correct, step 609 advances to normal peripheral edge exposure mode. Also, if N>1 in step 601, in step 612 the minicomputer 202b makes a calculation for judging whether or not stable peripheral exposure is possible in an angular range of each of the divided regions corresponding to the step number N.

When peripheral exposure is performed as shown in FIG. 17 with the equipment shown in FIG. 15, there is the need for synchronizing the angular position of the wafer W detected by the encoder 12b and the counter circuit 16b in FIG. 15 with the opening and closing timing of the shutter 36b. During the time the shutter 36b makes one revolution, a minimum value determined by mechanical and electrical elements exists and the shutter 36b cannot be opened or closed in a time shorter than the minimum value. Also, if the time required for the shutter 36b to be fully opened does not exist, the intensity of a light beam $IL_m$ from the optical fiber 21b will become an improper value and a sufficient circumferential length cannot be obtained in each of the divided regions $AP_1$ through $AP_2$ exposed in the target exposure quantity.

For the aforementioned reason, after the time required for the shutter 36b to be fully opened is obtained to a certain degree, the minimum time $T_{min}$ of the shutter 36b is spontaneously determined between the time that the shutter is opened and the time that the shutter is closed. Therefore, a value, which is obtained by dividing the time $T_c$ of one revolution of the wafer corresponding to the maximum value of the wafer rotational speed by the minimum time $T_{min}$ of the opening and closing of the shutter 36b, becomes the maximum number of divisions. When the set step number N is equal to or greater than the maximum number of divisions, test exposure becomes impossible. Because the maximum number of divisions (upper limit) is known in advance from the performance of the apparatus, it is set to a memory (or a program) of the minicomputer 202b as a constant.

Therefore, when, in step 612, the step number N exceeds the upper limit (the maximum number of divisions), in step 614 the minicomputer 202b displays an error message on the display 204b and waits for a confirmation or change input from the operator. When the minicomputer 202b receives a change input, in step 607 the minicomputer 202b accepts correction of parameters.

If, in step 612, the step number N is judged to be correct, in step 616 the minicomputer 202b calculates the rotational speeds of the wafer which corresponds to the minimum target exposure quantity and the maximum target exposure quantity and in step 617 judges whether or not the rotational speeds calculated exceed the upper control limit.

In step 616, the maximum target exposure quantity, $CX_{max}=CX_v+(N/2)\Delta V_x$, and the minimum target exposure quantity, $CX_{min}=CX_v-(N/2)\Delta V_x$, are calculated by using the center target exposure quantity $CX_v$, the deviation width $\Delta V_x$, and the step number N.

The maximum exposure quantity, $CX_{max}$, is obtained by reducing the rotational speed of the turn table down to a certain value, while the minimum exposure quantity, $CX_{min}$, is obtained by increasing the rotational speed of the turn table up to a certain value. Then, in step 617 the minicomputer 202b determines whether or not the rotational speed of the turn table is within a range where the speed of the turn table can be changed physically. When the speed of the turn table is within the speed changeable range, the minicomputer 202b starts the operation of test exposure. When, on the other hand, the turn table speed is judged to be outside the speed changeable range in step 617, the minicomputer 202b returns back to the aforementioned steps 614 and 607 for accepting correction of parameters.

Notice that, although it has been described that the parameters which are set at the time of test exposure are the center target exposure quantity $CX_v$, the deviation width $\Delta V_x$, and the step number N, the present invention is not limited to this setting. For example, the circumferential lengths (or angular ranges) of the divided exposure regions $AP_1$ through $AP_2$, and the number of wafers where test exposure is performed (ranges of values of parameters that are set are changed for each wafer) may be additionally set at the time of test exposure.

The various kinds of parameters and commands (specification of the number of wafers that are processed, specification of the number of wafers at the head of a lot, method of carrying a wafer, etc.), which have set in the minicomputer 202b in the aforementioned way, are transmitted to the MPU of the wafer carrier system 122b through the bus $S_{bs}$ of FIG. 16 as primary commands and parameters. The MPU of the carrier system 122b distributes the primary commands and parameters to the MPU of the peripheral edge exposure unit 32b and the MPU of the wafer loader and prealignment unit 33b as needed.

The test exposure sequence by control of the MPU 32b will next be described in reference to FIG. 19.

Figure 19:
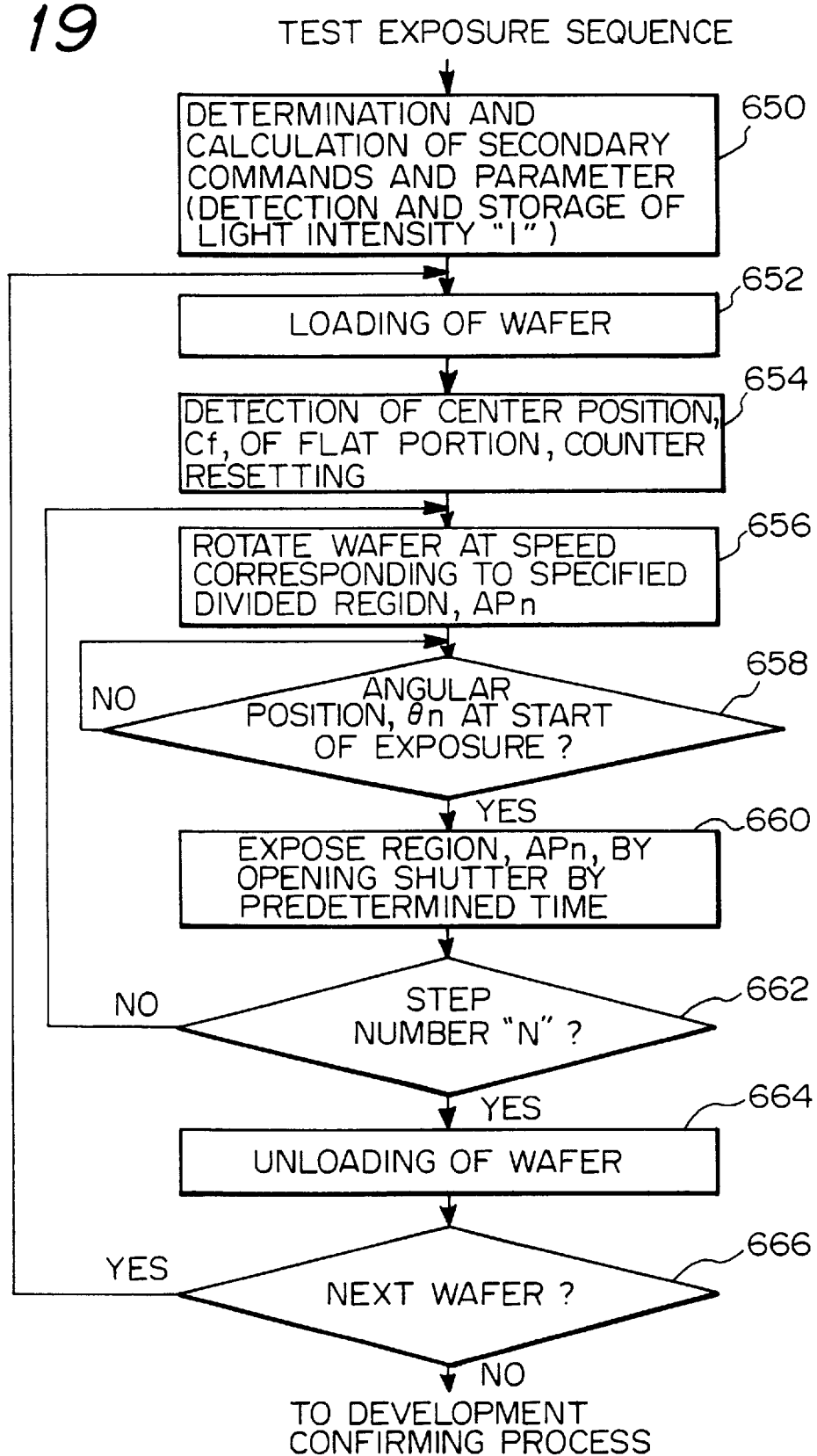
FIG. 19 is a diagram showing the rough sequence of an exposure operation at the time of test exposure.

In step 650 of FIG. 19, the MPU 32b performs various kinds of calculations for developing transmitted primary commands and parameters to secondary commands and parameters. The secondary commands include the start of rotation of the turn table motor 11b in FIG. 15, the output of the speed command signal $S_v$, the command output of the motor 38 for driving the shutter 36b, the output of a signal to the differential circuit 27b for setting the exposure width $S_c$ (see FIG. 17), etc. Also, the angular positions of the divided exposure regions $AP_1$ through $AP_2$ of the outer circumference of the wafer, the values of the rotational speeds of the turn table (motor 1) respectively corresponding to the divided exposure regions $AP_1$ through $AP_2$, the open times of the shutter 36b at the time each divided exposure region is exposed (it is desirable that the open time slightly varies, because the rotational speed varies for each divided exposure region), etc., are calculated as secondary parameters.

However, since the aforementioned secondary parameters depend upon the intensity, I, of a light beam $IL_m$ irradiated from the optical fiber 21b, it is beneficial that the secondary parameters are calculated in step 650 after the level on a signal which is output from the light receiving element 22b when there is no wafer, are read in through the A/D converter of the IFU 31b.

Next, in step 652 the wafer W is loaded on the turn table, and the wafer W is held on the turn table by vacuum suction so that the center point of the wafer and the rotational shaft CC of the turn table are within a predetermined allowable deviation range (e.g., ± a few millimeters). Note that step 652 is executed by the wafer loader and prealignment unit (MPU) 33b, as evident also from the structure of FIG. 16.

Next, in step 654 the MPU 32b rotates the motor 11b at a predetermined speed and detects the center position $C_f$ (see FIG. 3) of the flat portion OF of the wafer margin by using the light receiving element 18b and the flat-portion detecting circuit 19b shown in FIG. 15. At this time, the flat-portion detecting circuit 19b outputs a pulsed signal at the time the light spot from the light emitting diode 17b has corresponded with the center position $C_f$ of the flat portion OF and so the pulsed signal is output as a reset pulsed signal to the counter circuit 16b. The reset operation is performed only once, when the flat portion OF is detected. Thereafter, each time the counter circuit 16b itself counts a count value corresponding to one revolution of the wafer, it is reset.

Therefore, with execution of step 654, the MPU 32 can obtain the relative relation (rotational angular relation) between the position of a light beam $IL_m$ from the optical fiber 21b and the outer circumferential position of the wafer with the center position $C_f$ of the flat portion OF of the wafer as a reference.

In the next step 656, the MPU 32b outputs a command signal $S_v$ to the drive circuit 13b through the differential circuit 15b for driving the motor 11b at a rotational speed which corresponds to the target exposure quantity set with respect to one of the specified divided exposure regions $AP_n$ (where n=1, 2, . . . , and N). At this point, a table of secondary parameters such as that shown in FIG. 20 has been generated in a memory of the MPU 32b by the aforementioned execution of step 650. Although, in this embodiment, peripheral exposure is concretely (physically) controlled based on the values shown in FIG. 20, the parameters are not always formed as a table. For example, each time each divided exposure region $AP_n$ is exposed, a calculation may be made to determine a value of each parameter, and based on the value, peripheral exposure may be controlled in sequence.

FIG. 20 shows, as an example, a case where the center target exposure quantity $CX_v$ is 200 mJ, the deviation width $\Delta V_x$ is 10 mJ, and the step number N is 6.

In this case, the minimum target exposure quantity with respect to the divided exposure region $AP_1$ is set to 170 mJ, and the target exposure quantity is set to 180 mJ, 190 mJ, 200 mJ, 210 mJ, and 220 mJ in order of regions $AP_2$, $AP_3$, $AP_4$, $AP_5$, and $AP_6$.

Also, the angular position in FIG. 20 assumes a value which is increased by 45° at a time, because the peripheral portion of the wafer W is divided as shown in FIG. 17 when N=6. For their first term in the angular position column, the start exposure angles, $\theta_1, \theta_2, \ldots$, and $\theta_N$, of a light beam $IL_m$ with respect to the divided exposure regions $AP_n$ are stored by the aforementioned calculation in step 650.

Furthermore, for the second term in the angular position column, the angular ranges $\Delta\theta_p$, which correspond to the circumferential lengths of the divided exposure regions $AP_n$, are set. In this case, the circumferential lengths of the divided exposure regions $AP_n$ are taken to be the same. Of course, the angular range $\Delta\theta_p$ may be varied for each region $AP_n$.

Also, the speeds, $V_1, V_2, \ldots$, and $V_N$, of FIG. 20 are calculated based on the circumferential width D of a light beam $IL_m$, the target exposure quantity of each region $AP_n$, and the intensity, I, of a light beam $IL_m$. In practice, each speed is converted to the value of a signal $S_v$, which is input to the drive circuit 13b to drive the motor 11b in FIG. 15, and the converted value is stored.

The shutter times, $T_{s1}, T_{s2}, \ldots$, and $T_{sN}$, of FIG. 20 are calculated based on the speed, $V_1, V_2, \ldots$, and $V_N$ of each region $AP_n$, and the angular ranges $\Delta\theta_p$. The shutter time, $T_{s1}, T_{s2}, \ldots$, and $T_{sN}$, becomes necessary in the case of timer mode where the shutter 36b is controlled with a timer (the open time of the shutter is controlled with a clock timer), but the shutter times are not needed in the case of position synchronization mode where the shutter is opened or closed by detecting that the rotational angular position of the wafer W, that is, the count value of the counter circuit 16b has reached a predetermined value ($\theta_n, \theta_n+\Delta\theta_p$).

In the aforementioned step 656 of FIG. 19, the MPU 32b outputs the rotational speed value $V_1$ of the turn table, which corresponds to the region $AP_1$ of FIG. 20, to the drive circuit 13b as a command signal $S_v$ of FIG. 15. The MPU 32b reads out the output of the tacho-generator of the amplifier 14b to confirm that rotation of the wafer W has reached a speed $V_1$. After confirmation, the MPU 32b reads in the count value of the counter circuit 16b in step 658 of FIG. 19 and compares the count value with the angular position $\theta_1$ at the start of exposure with respect to the region $AP_1$ shown in FIG. 20.

If it is judged in step 658 that the rotational angular position of the wafer W has corresponded with the start exposure position $\theta_1$ of the region $AP_1$, in step 660 the MPU 32b outputs a drive command to the motor 38b for opening the shutter 36b. Thereafter, when the shutter control method is in timer mode, the MPU 32b instructs the motor 38b to close the shutter 36b by referring to the value of the shutter time $T_{s1}$ shown in FIG. 20.

When, on the other hand, the shutter control method is in position synchronization mode, the MPU 32b reads out the count value of the counter circuit 16b and instructs the motor 38b to close the shutter 36b, at the time when the count value has reached the angular position ($\theta_1+\Delta\theta_p$). With the aforementioned operation of step 660, the region $AP_1$ is exposed with the target exposure quantity 170 mJ.

Next, in step 662 of FIG. 19 the MPU 32b judges whether or not the test exposure has been performed in all of the specified N regions $AP_1, AP_2, \ldots$, and $AP_N$. When the test exposure has not been performed in all regions, the MPU 32b repeats the aforementioned step 656 and the steps thereafter. At this time, if exposure of the second region $AP_2$ is specified, it is not necessary to mention that the parameter values ($V_2, T_{s2}, \theta_2$) about the region $AP_2$ are set from the values shown in FIG. 20.

If it is judged in step 662 that exposure of the specified N regions $AP_1, AP_2, \ldots$, and $AP_N$ has ended, in the next step 664 the MPU 32b unloads the exposed wafer W and in step 666 judges whether or not the test exposure of the next wafer is performed. When the next wafer is processed, the aforementioned steps 652 through 664 are likewise repeated.

It is the primary object of this embodiment to find optimum exposure conditions at the time of peripheral exposure with a single sheet of wafer, however, when there is a large number of change steps of target exposure quantities (step number N) at the time of test exposure and so test exposure cannot be performed in a sheet of wafer, or when test exposure is performed in a plurality of sheets of wafers under the same condition for confirming reproducibility, two or more sheets of wafers can also be used.

If the test exposure of a required number of sheets of wafers has been completed with the aforementioned steps 650 through 666, the wafers are sent to a development process and the resist film on the divided exposure regions $AP_1$, $AP_2$, . . . , and $AP_N$ of each wafer is removed in the same condition as that used in an actual wafer process.

In a region to which an appropriate exposure quantity is given in correspondence with the thickness and kind of a resist film on the wafer peripheral portion, the resist film in that region is completely removed, while in a region where exposure is insufficient, the resist film is reduced only in thickness and cannot be completely removed.

Figure 21:
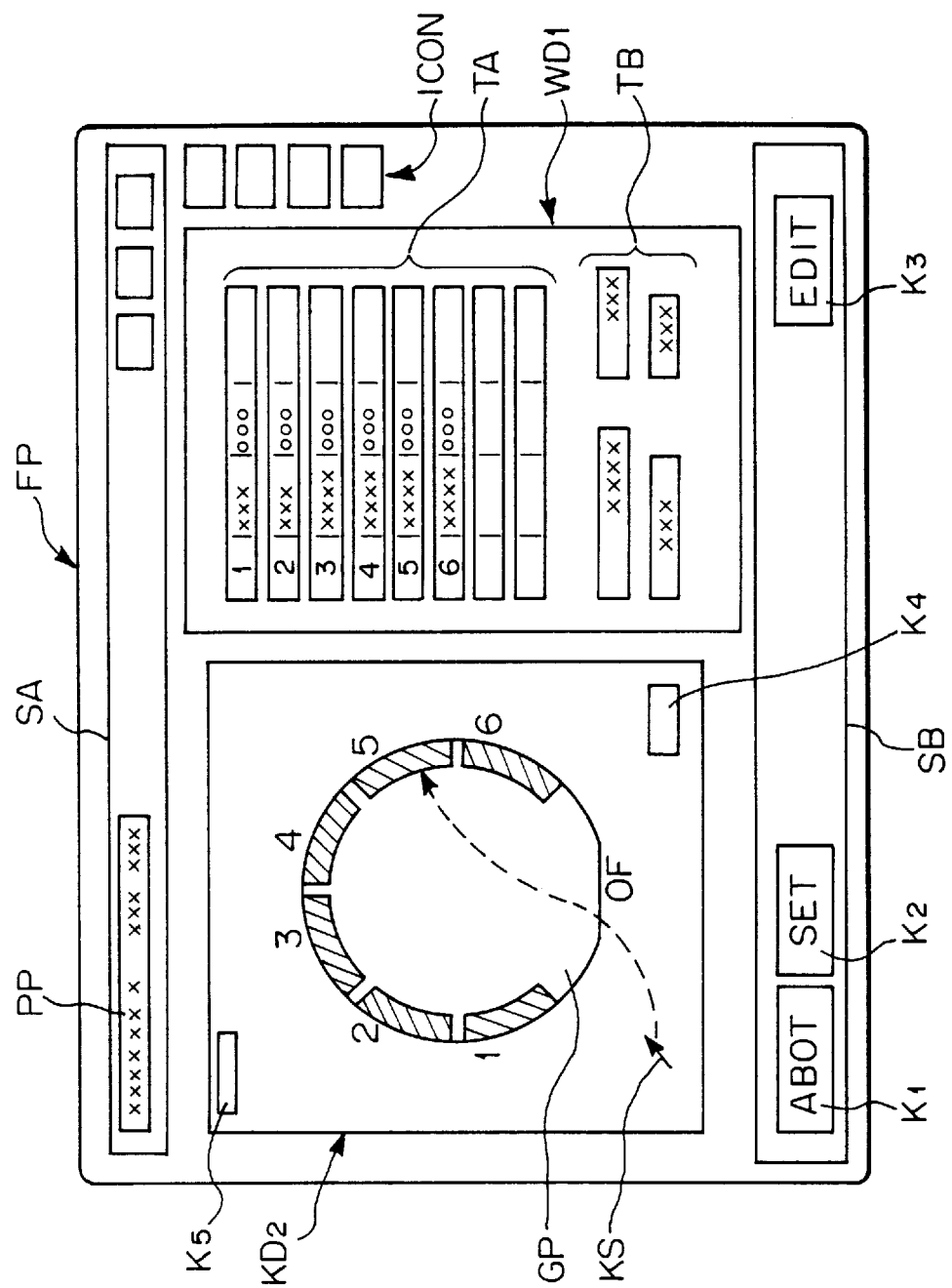
FIG. 21 is a diagram showing an example of a screen which is displayed in a terminal display at the time of test exposure.

Then, the operator visually observes the developed wafer and confirms the region $AP_n$ where the resist film starts to be completely removed. When this confirmation operation is performed, the operator inputs a command to the minicomputer 202b so that an input screen for optimum exposure conditions is displayed on the display 204b. FIG. 21 shows an example of the input screen. The minicomputer 202b sets a title display region SA on the upper portion of the input screen FP and displays a processed program name PP in the title display region SA. Also, in the lower portion of the screen FP there is set an instruction region SB, where execution switches $K_1$, $K_2$, and $K_3$ (clicked by the mouse 207b) are displayed. The switch $K_1$ is used to change the current screen to the previous screen, and the optimum exposure conditions set in this screen are all canceled. The switch $K_2$ is used to register various kinds of parameters (optimum exposure conditions) set in this input screen to a disk memory 52 serving as data base. The switch $K_3$ is used to specify the start of editing of various kinds of parameters. These switches $K_1$, $K_2$, and $K_3$ are input by moving a cursor KS interlocked with the mouse 207a onto a desired switch and clicking the button of the mouse 207b.

Furthermore, on the right half of the screen FP there is set a window WD1, which includes a region TA that displays various kinds of parameters used at the time of test exposure for the set divided exposure regions $AP_1$, $AP_2$, . . . , and $AP_N$ and a region TB that collectively displays primary commands and parameters.

The window WD1 is also set in setting primary commands and parameters, and in the region TB, numerical values, such as a step number N, a center target exposure quantity $CX_y$, a deviation width $\Delta V_x$, and a number of sheets of wafers, are input. Furthermore, the region TB includes an area which displays the value of the light intensity, I, of a light beam $IL_m$ measured in the aforementioned step 650 of FIG. 19.

On the left half side of the screen FP of FIG. 21, a graphic display GP of the outer shape of a wafer which schematically illustrates the positions of the divided exposure regions $AP_n$ on the wafer is displayed within a window WD2. The oblique line portions (hatched portions) within the graphic display GP diagrammatically represent the divided exposure regions $AP_n$ of the wafer peripheral portion which are exposed, and numbers are applied to the respective regions. The graphic display GP is displayed at the stage before the test exposure sequence, that is, at the time correctness of parameters has been confirmed in step 617 of FIG. 18. Therefore, with the graphic display GP of FIG. 21, the operator can visually grasp how the peripheral portion of a wafer is exposed by test exposure which is going to be executed.

Now, to set optimum exposure conditions, the operator confirms the developed wafer W with the window WD2 of FIG. 21 displayed. When the divided exposure region $AP_n$ where optimum exposure conditions have been achieved is, for example, region $AP_5$, the cursor KS is first moved onto the hatched portion No. 5 of the graphic display GP and then the button of the mouse 207b is clicked. Thereafter, the cursor KS is moved onto the setting switch K4 and the button of the mouse 207b is clicked.

With the aforementioned operation, various kinds of parameters that were used at the time of the test exposure of the divided exposure region $AP_5$ are temporarily registered in the minicomputer 202b as optimum exposure conditions. When the registration occurs, the display color of the divided exposure region $AP_5$ displayed in the region TA of the window WD1 changes, thereby representing that the optimum exposure conditions have been set.

Note that a switch $K_5$, which is used to turn pages when there are a plurality of sheets of wafers, is displayed on the upper left portion of the window WD2. When the switch $K_5$ is turned on the mouse 207b, the aforementioned graphic display GP is changed so as to represent the outer shape of the next wafer.

If optimum exposure conditions are determined in the aforementioned way, the operator will turn on the switch $K_2$, thereby completing all of the test exposure command operations. When, on the other hand, optimum conditions are not found sufficiently from the state of the developed wafer, the operator turns on the switch $K_3$ to edit parameters.

The editing operation is completed by appropriately changing the previous values of the parameters (center target exposure quantity $CX_y$, deviation width $\Delta V_x$, etc.) displayed on the window WD1. If the editing operated is completed, then the operator will push the switch $K_1$ to switch the window WD2 to a test exposure execution window. Thereafter, similar test exposure is performed in a new wafer, and evaluation of the developed wafer is repeatedly performed.

Among the optimum exposure conditions set in the aforementioned way, the most important parameter is a value of a target exposure quantity and so the minicomputer registers the target exposure quantity as a final target exposure quantity CXT.

However, it is considered that the set exposure quantity CXT is determined, including an error of the deviation width $\Delta V_x$ of the exposure quantity at the time of test (pilot) exposure and that the thickness of the resist film on the peripheral portion of the wafer slightly varies for each wafer. Therefore, when peripheral exposure is actually performed, a corrected exposure quantity is obtained by correcting the target exposure quantity CXT so as to be increased by a predetermined value, for example, about 10 to 50%.

The numerical correction of the target exposure quantity may be made either at the minicomputer 202b or at the MPU 32b, but, in either case, the rotational speed of a wafer is reduced to 1/1.1 to 1/1.5 (about 90 to 67%) of the speed found at the time of test exposure under the optimum conditions.

In the first embodiment of the present invention, as described above, the operation of determining optimum exposure conditions is advanced, while it is being confirmed visually by using the graphic display GP of FIG. 21.

Therefore, this embodiment has the advantage that errors are difficult to occur. In addition, in the first embodiment the correctness of the primary parameters set by the operator is judged before test exposure, so meaningless test exposure is prevented from being performed by simply mistaken inputs and set values.

Incidentally, during the time the test exposure is performed, the optical fiber 21b shown in FIG. 15 irradiates or shutters a light beam $IL_m$ to a wafer edge with the opening and closing of the shutter 36b. For this reason, the control of the tracking servo system for the movable arm or slider 20b, which comprises the photoelectric sensor 21b, the amplifier 24b, the differential circuit 27b, and the control circuit 26b, virtually becomes impossible. Therefore, when the center point of the wafer W is not largely offset from the rotational center CC of the turn table, for example, when the center point is within an offset range of about ±2 mm, the tracking servo operation is prohibited and the exposure width $S_c$ of the peripheral portion of the wafer is set to a fixed value larger than the offset range. For example, the position of the slider 20b is fixed so that the exposure width becomes about 10 mm.

In the above case, due to the influence of the offset, the divided exposure regions $AP_n$ of the wafer where the test exposure was performed differ in exposure width $S_c$, depending on the circumferential position, however, there is no practical problem, as long as it is a main object to determine an optimum exposure quantity.

Also, in the case of some tracking systems, a better tracking servo control is possible even during test exposure. One of the systems is a dummy tracking system disclosed in Japanese Laid-Open Patent Publication No. Hei 4-72614. Another system, as disclosed in Japanese Laid-Open Patent Publication No. Hei 1-132124, is a method where light receiving elements for detecting the position of the peripheral edge of a wafer are disposed at positions separated by a fixed angle at a time on the wafer from the illumination range of a light beam $IL_m$ and where non-photosensitive illumination light is projected from another light source on the light receiving elements.

In either of the two tracking methods, during the time a wafer edge is exposed with an exposure illumination light beams from an optical fiber, there is no possibility that part of the exposure illumination light beams is photoelectrically detected for a tracking servo control. Therefore, even in a case where an illumination light beam $IL_m$ is intermittently irradiated as in the case of test exposure, an accurate exposure width $S_c$ (see FIG. 17) can be kept. This means that, even when the center of a wafer and the rotational center CC of a turn table are largely offset (about ±5 mm) comparatively, better test exposure is possible and an operation of confirming accuracy of the exposure width $S_c$ from the wafer where test exposure was performed, that is, tracking accuracy is also possible.

To perform the operation of confirming tracking accuracy, the minicomputer 202b is programmed so that the exposure width $S_c$ can be specified to an arbitrary value as a parameter for each divided exposure region $AP_n$. With this function, if it is, for example, assumed that the target exposure quantities with respect to two adjacent divided exposure regions are the same, the target exposure widths $S_c$ of the two divided exposure regions can be set to different values, for example, 3 mm and 6 mm. And, when tracking accuracy is confirmed, the exposure widths $S_c$ of the divided exposure regions of the developed wafer are actually measured and the measured values are compared with the target values.

A modification of the test exposure operation of the aforementioned embodiment will next be described. In this embodiment, the sequence of the exposures of divided exposure regions $AP_n$ which are set on the peripheral portion of a wafer is changed in correspondence with the responsibility at the time of the change of the rotational speed of the turn table, thereby minimizing wasteful rotation of the wafer.

Figure 22:
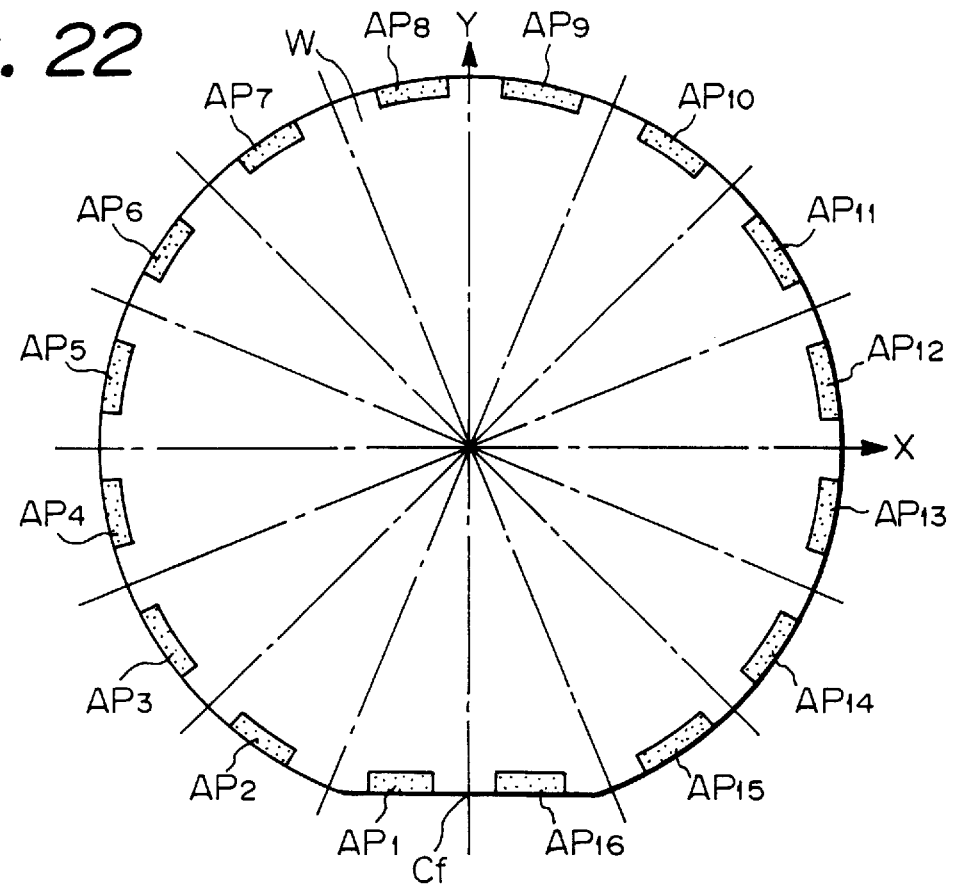
FIG. 22 is a diagram showing the state of a wafer exposed under another condition at the time of test exposure.

For example, if the total number of the divided exposure regions $AP_n$ of the wafer margin (16 regions in FIG. 22) is increased, as shown in FIG. 22, then the space between adjacent regions will necessarily become narrower. For this reason, between the time that exposure of a certain divided exposure region is completed (the closing of the shutter 36b is completed) and the time that it is confirmed that the rotational speed of the wafer W has reached a target speed by increasing or decreasing by a predetermined quantity, there is the possibility that the next divided exposure region has already reached under the emergent end of the optical fiber 21b.

Therefore, in the case such as FIG. 22, the divided exposure regions are specified so that they are exposed alternately. After the minicomputer 202b judges correctness of parameters, it is determined, based on the total number (step number N) of the divided exposure regions $AP_n$ and the circumferential length of each of the divided exposure regions $AP_n$, at what sequence the exposure regions are exposed. As an example, in FIG. 22, 16 divided exposure regions $AP_1$ through $AP_{16}$ exist and they are exposed in sequence of $AP_1 \rightarrow AP_3 \rightarrow AP_5 \rightarrow AP_7 \rightarrow AP_9 \rightarrow AP_{11} \rightarrow AP_{13} \rightarrow AP_{15} \rightarrow AP_2 \rightarrow AP_4 \rightarrow AP_6 \rightarrow AP_8 \rightarrow AP_{10} \rightarrow AP_{12} \rightarrow AP_{14} \rightarrow AP_{16}$.

If the exposure sequence is determined as described above, all of the divided exposure regions $AP_n$ are exposed during the time the wafer makes at least two revolutions. Furthermore, the rotational speed of the wafer which is set at the time of test exposure is not limited by the turn table or motor 1, or where the rotational speed is less than the responsibility of the tracking servo control. Therefore, it becomes possible to set a target exposure quantity over a wide range.

Another embodiment will next be described in reference to FIG. 23.

In this embodiment, the present invention is applied to an equipment that performs peripheral exposure with respect to a rectangular glass plate PLT used for manufacturing a liquid crystal device (LCD). In general, a larger plate PLT of that kind has a side of about 50 cm. For this reason, unlike the case of a wafer, peripheral exposure is performed by linearly moving the plate PLT and bundles of exposure illumination light beams $IL_1$ and $IL_2$ mutually in the directions indicated by arrows in FIG. 23.

Figure 23:
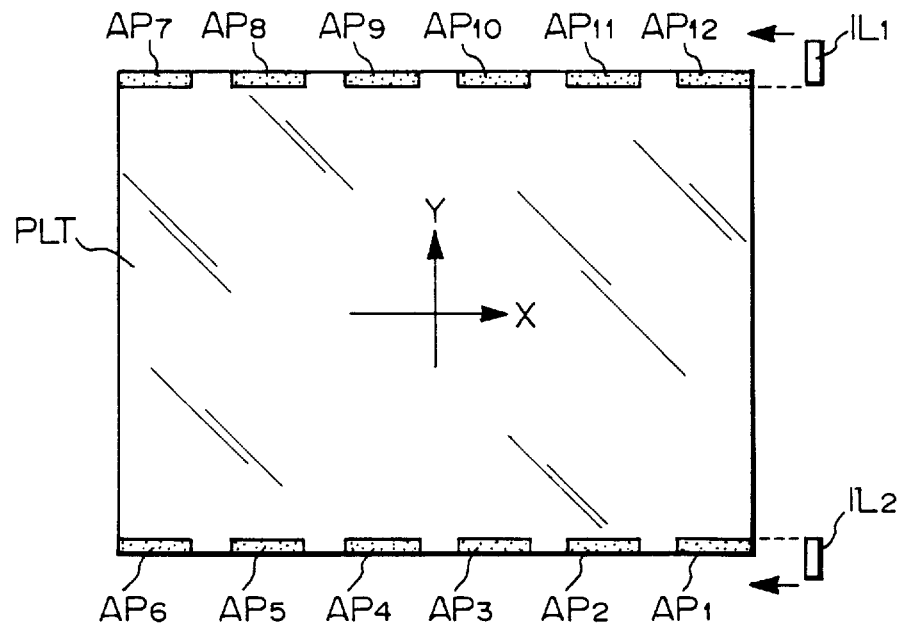
FIG. 23 is a diagram showing how test exposure is performed with respect to a rectangular photosensitive substrate.

A plurality of divided exposure regions $AP_n$, as shown in FIG. 23, are set straightly on the opposite edge portions of the plate PLT. The target exposure quantity with respect to each divided exposure region is set in the same way as the aforementioned embodiment. The adjustment of the exposure quantity in this case is also performed by changing the relative speed between the plate PLT and bundles of light beams $IL_1$ and $IL_2$. Also, it is preferable that the bundles of light beams $IL_1$ and $IL_2$ which are irradiated at two places are ideally adjusted to the same light intensity. However, when a difference of intensity cannot be adjusted to less than an allowable quantity (for example, 3%), peripheral exposure by a light beam $IL_1$ and peripheral exposure by a light beam $IL_2$ can be separately executed. However, in the case of actual peripheral exposure, it is beneficial, from the standpoint of throughput, that the two bundles of light beams $IL_1$ and $IL_2$ are used at the same time to expose the opposite edges of the plate PLT at the same time. Therefore, it is ideal that the difference of intensity between the two bundles of light beams $IL_1$ and $IL_2$ are set within an allowable range by using an appropriate means of adjusting a light quantity, such as an extinction filter, a variable diaphragm, and an optical splitter.

Now, the outer shape of the plate PLT of FIG. 23 is displayed as the aforementioned graphic display GP as shown in FIG. 21, and evaluation of test exposure and optimum exposure conditions is performed. In the example shown in FIG. 23, the 6 divided exposure regions $AP_1$ through $AP_6$ on the lower edge of the plate PLT are exposed by a light beam $IL_2$, while the 6 divided exposure regions $AP_7$ through $AP_{12}$ on the upper edge are exposed by a light beam $IL_1$.

Figure 24A:
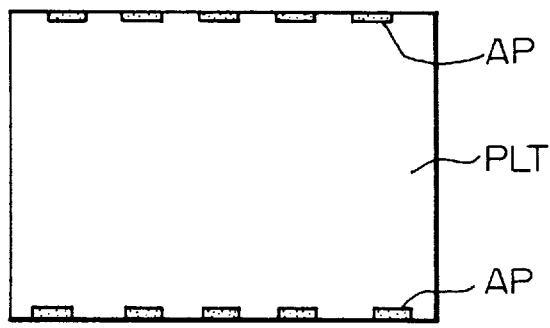
FIGS. 24A through 24D are diagrams showing modifications of peripheral exposed regions on a rectangular photosensitive substrate.
Figure 24B:
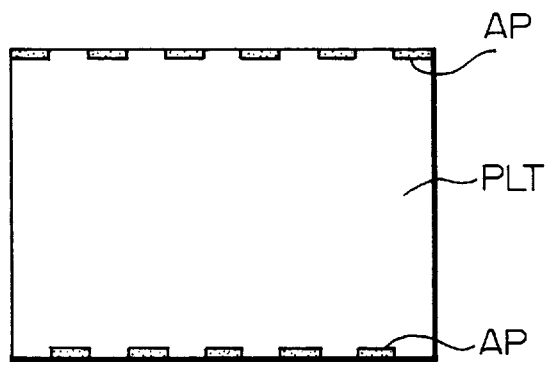
Figure 24C:
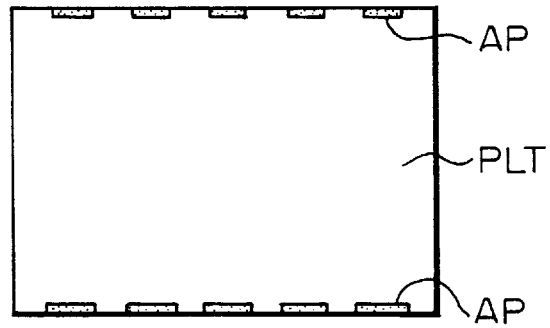
Figure 24D:
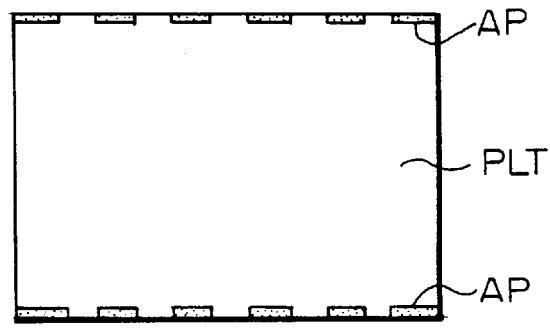

Incidentally, in the case of a rectangular plate, there is the possibility that evaluation of the divided exposure regions after development will be inverted in the vertical direction (Y direction), if the divided exposure regions are set at the same positions on the upper and lower edges as shown in FIG. 23. More specifically, the region $AP_1$ is often mistaken for the region $AP_7$ and the region $AP_6$ is often mistaken for the region $AP_{12}$. Then, to prevent the vertical mistake, (1) the position of the divided exposure region is varied so as to be identified between the upper and lower edges, as shown in FIG. 24A, (2) the number of the divided exposure regions is varied between the upper and lower edges, as shown in FIG. 24B, (3) the exposure width of the divided exposure region is varied between the upper and lower edges, as shown in FIG. 24C, or (4) the exposure width of only a certain divided exposure region is varied as shown in FIG. 24D. With this arrangement, the direction of the test-exposed plate PTL can be visually recognized.

Therefore, the operator can match the direction of the graphic display of the plate PLT displayed on the screen FP of FIG. 21 with that of the developed plate PLT without a mistake.

While, in FIG. 23, the divided exposure regions $AP_n$ have been set on both the upper and lower edges of the plate, they may be set only on either the upper edge or the lower edge.

Although, in the aforementioned embodiments, the minicomputer 202b has automatically computed the optimum positions and lengths of the divided exposure regions $AP_n$ if only primary parameters ($CX_x$, $\Delta V_x$, N) are input in performing test exposure, the operator may manually execute the setting of the positions and lengths of the divided exposure regions $AP_n$ while individually judging them.

For that reason, the minicomputer 202b is programmed so that the graphic display GP of the window WD2 shown in FIG. 21 can be displayed as an input screen when parameters are set and that the central position or exposure start position (the angle $\theta_n$ of FIG. 20) of the divided exposure region $AP_n$ can be set by moving cursor KS onto the exposure region on the graphic display GP with mouse 207b and clicking the button of the mouse 207b on the wafer edge portion in the screen.

Furthermore, the target exposure quantity, the exposure width $S_c$, and the circumferential length of the set divided exposure region $AP_n$ are input to the minicomputer 202b through the keyboard 206b.

In the above case, the position specification of the divided exposure regions $AP_n$ with cursor KS is not very accurate, but the operator can simply specify the positions visually and so operability is enhanced.

Then, an example of the aforementioned manual set operation will be described in detail in reference to FIGS. 25A through 25C.

Figure 25A:
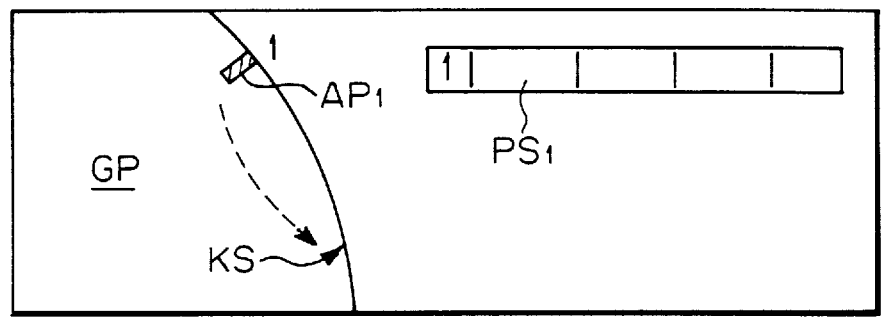
FIGS. 25A through 25C are diagrams showing how the screen of the terminal display is changed when the peripheral edge exposure apparatus is set by a manual operation in performing test exposure.
Figure 25B:
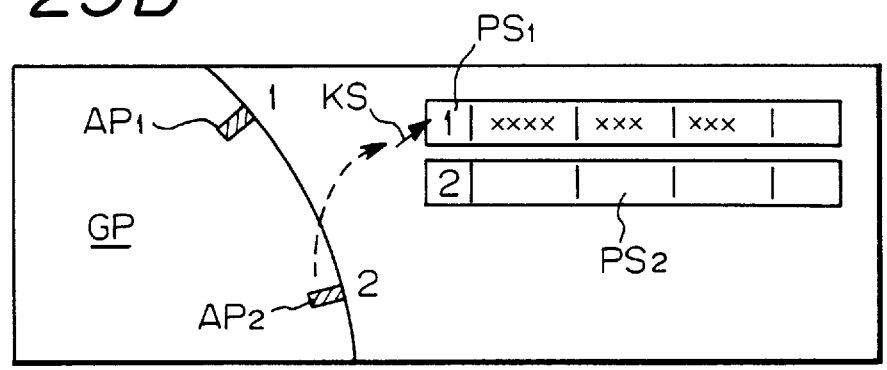
Figure 25C:
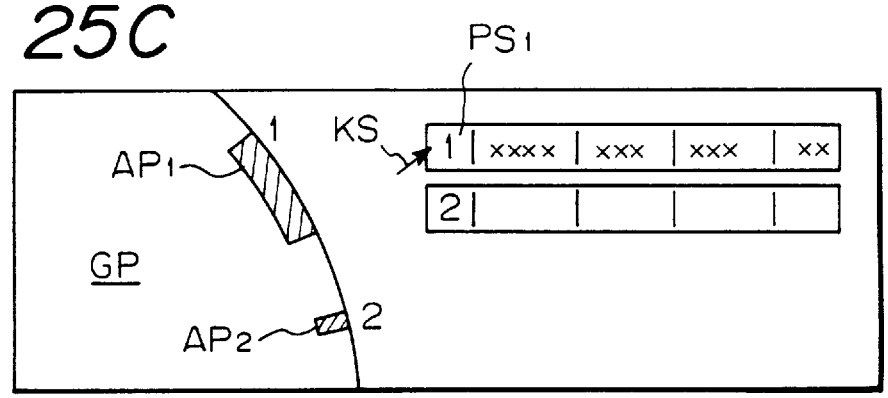

FIGS. 25A through 25C illustrate part of the window WD2 on an enlarged scale in FIG. 21. On the graphic display GP of FIG. 25A, a slit marker which represents specification of the first divided exposure region $AP_1$ is changed in color and displayed. At the same time, an input region $PS_1$ is opened for inputting various kinds of parameters about the first divided exposure region $AP_1$.

Now, if cursor KS is moved to another position on peripheral edge of the wafer and clicks, as shown in FIG. 25A, the screen changes as shown in FIG. 25B. A marker which represents specification of the second divided exposure region $AP_2$ is changed in color and displayed, and an input region $PS_2$ is opened for inputting various kinds of parameters about the second divided exposure region $AP_2$.

Next, if the cursor KS is moved to the input region $PS_1$ and clicks, input of various kinds of parameters becomes possible through the keyboard 54. Then, the operator sets various kinds of parameters (target exposure quantity, exposure width $S_c$, exposure length, etc.) as to the first divided exposure region $AP_1$. If the operator reconfirms the input values and presses the return key of the keyboard 54, the minicomputer 202b calculates a table such as FIG. 20 from the input parameter values and obtains the exposure start angular position $\theta_1$ and the angular range $\Delta\theta_p$ (corresponding to length) of the divided exposure region $AP_1$.

Based on the calculated exposure start angular position $\theta_1$ and angular range $\Delta\theta_p$, the minicomputer 202b enlarges the display marker of the region AP1 on the graphic display GP to a corresponding circumferential length, as shown in FIG. 25C.

The aforementioned operation is executed for each region $AP_n$ to set a predetermined number of divided exposure regions and various kinds of parameters about the exposure regions. Thus, in this embodiment, a plurality of divided exposure regions on a wafer where test exposure is performed can be set to arbitrary positions with the personal judgment of the operator. Of course, in view of the overall balance, the position or length of the divided exposure region $AP_n$, which was set once, can be freely corrected and deleted.

The circumferential length of the marker, which is displayed when the position of the divided exposure region $AP_n$ is specified with the cursor KS as shown in FIGS. 25A through 25C, corresponds to the minimum value of an exposure region that can be set, and the minicomputer 202b automatically sets the minimum default value of the angular range $\Delta\theta_p$ about the divided exposure region displayed as a marker on the table of FIG. 20.

Next, a modification of a method of adjusting an exposure quantity will be described. In the aforementioned embodiments, an exposure quantity is adjusted by changing the relative scanning speed between a bundle of exposure light beams and a wafer (or a plate).

However, the adjustment of the exposure quantity, in addition to the aforementioned method, is also possible by (1) changing the intensity of a bundle of illumination light beams $IL_m$ ($IL_1$, $IL_2$) on a substrate, or (2) changing the effective width D of the exposure scanning direction of the bundle of illumination light beams $IL_m$.

The intensity of the bundle of illumination light beams $IL_m$, when the light source 35b of FIG. 15 is a mercury discharge lamp, can be adjusted by varying power, which is supplied to the lamp, in a range from a rated value to twice as large value. In this case, the intensity of a bundle of illumination light beams $IL_m$ can be increased up to about twice as large as a rated value.

Figure 26:
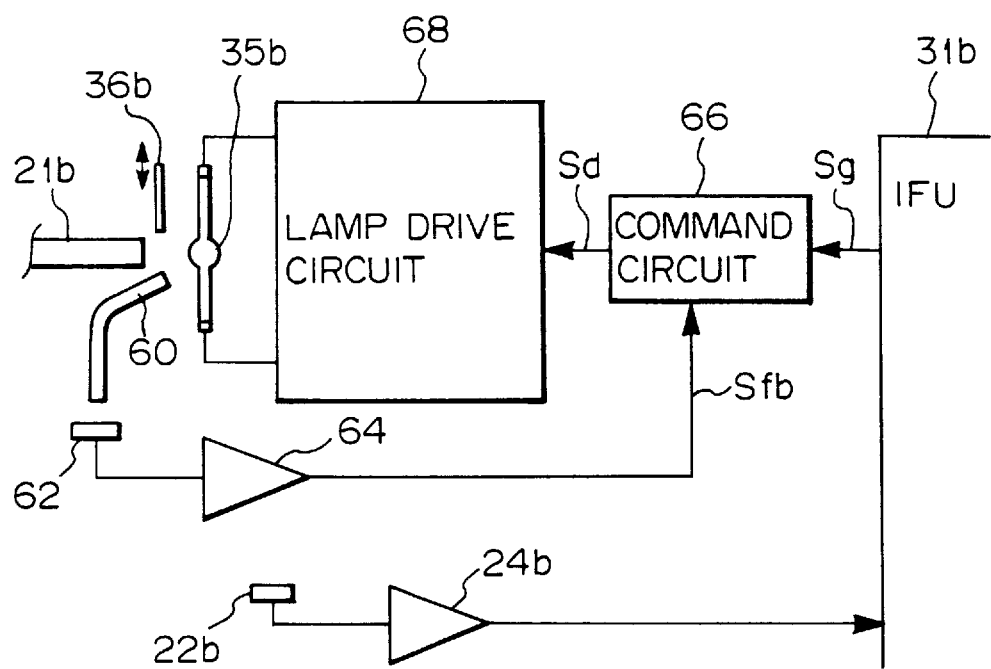
FIG. 26 is a block diagram showing the structure of a constant-illuminance power supply which performs the feedback control of the light intensity of a light source for controlling a quantity of exposure.

FIG. 26 shows a block diagram of a power supply circuit that lights the mercury lamp 35b. An optical fiber 21b is used to guide the bundle of exposure light beams $IL_m$. Another optical fiber 60 is used for receiving exposure light (where the wavelength band is the same as the light beam $IL_m$) from a lamp 35b at all times independently of the opening and closing of a shutter 36b and guiding the received exposure light to a light receiving element 62. A photoelectric signal from the light receiving element 62 corresponds to the intensity of exposure light, is amplified with an amplifier 64, and is input to a command circuit 66 as a feedback signal $S_{fb}$.

The command circuit 66 compares a command signal $S_g$ output from the MPU 32b through the interface unit 31b of FIG. 15 with the aforementioned feedback signal $S_{fb}$ and then outputs a drive command signal $S_d$ to a lamp drive circuit 68 so that the command signal and the feedback signal are in a predetermined level relationship. In response to the drive command signal $S_d$, the lamp drive circuit 68 adjusts electric power (product of drive voltage and drive current) which is supplied to the lamp 35b, and the light beam $IL_m$ with an intensity corresponding to the command signal $S_g$ is obtained.

Therefore, in order to obtain a target exposure quantity set for each divided exposure region $AP_n$ at the time of test exposure, the rotational speed of a wafer is made constant and, in this state, the command signal $S_g$ (intensity, I) is varied, or both the rotational speed and the command signal $S_g$ are developed to secondary parameters so that they are varied as needed.

In addition, if a constant illuminance power supply such as the one shown in FIG. 26 is used, the intensity of the light from the lamp 35b can be held to a constant value for a long period of time and so there is no need for frequently measuring the intensity, I, of the light beam $IL_m$ with the photoelectric sensor 21b used for wafer edge detection, thereby achieving more stable peripheral exposure. Furthermore, the photoelectric signal of the photoelectric sensor 21b is read out by the MPU 32 through the amplifier 24b. Therefore, in calibrating the intensity, I, of a light beam $IL_m$ to a predetermined value when there is no wafer, the command signal $S_g$ is sequentially varied until the output signal level of the amplifier 24b reaches a predetermined value, and at the time the output signal level of the amplifier 24b has reached a predetermined value, the command signal $S_g$ is thereafter held as a reference value. If done in this way, the intensity, I, of a light beam $IL_m$ can be held to a constant value independently of the secular change of the lamp 35b until the next calibration.

Another means of adjusting the intensity, I, of a bundle of illumination light rays $IL_m$ is that an extinction filter whose transmittance varies continuously or discretely is disposed on the incident end side of the optical fiber 21b. In this case, a secondary parameter is a value relating to the transmittance of the extinction filter. Also, even when the extinction filter is used, a target exposure quantity at the time of exposure of peripheral edge can be finely varied over a wider range, if the rotational speed of a wafer or the intensity of light emitted from a light source is adjusted at the same time.

On the other hand, a means of varying an effective width D of the bundle of illumination light beams $IL_m$ can be achieved by providing a variable diaphragm, as shown for example in U.S. Pat. No. 5,168,304. With an idea similar to this publication, it is also possible to provide a variable diaphragm on the entrance side of the optical fiber 21b of FIG. 15. In this case, a special kind of optical fiber such as that shown in FIG. 27 is used as the optical fiber 21b.

Figure 27:
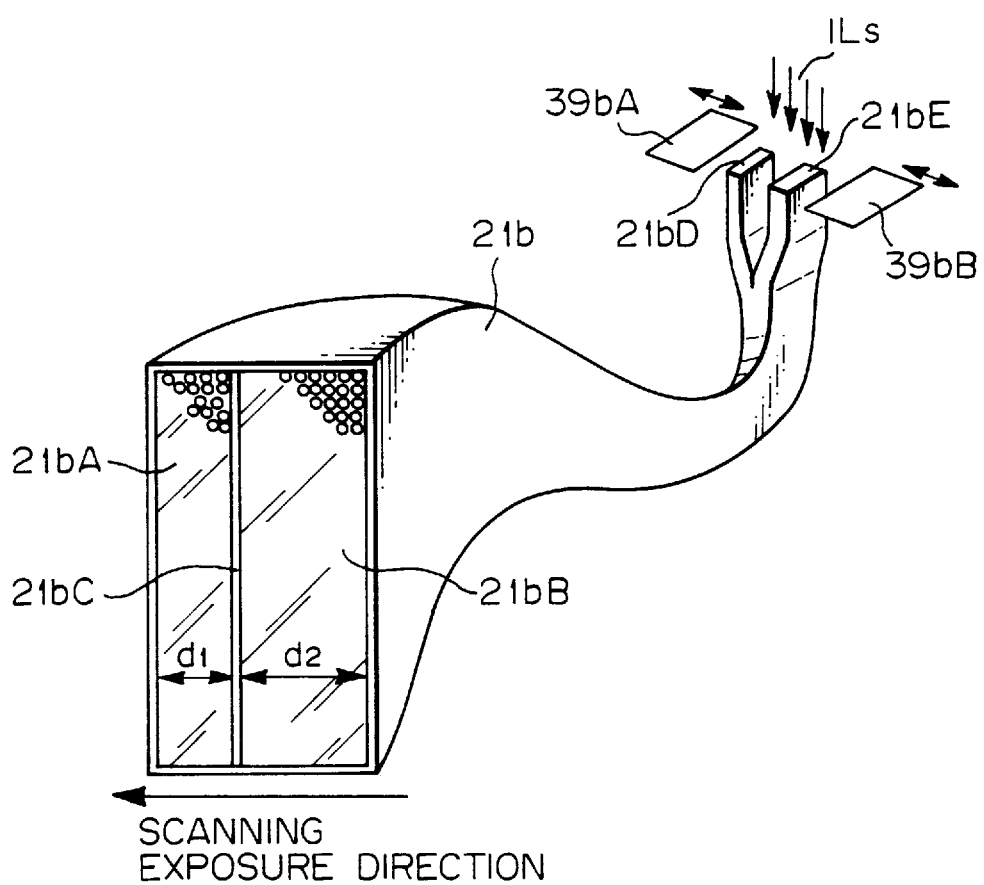
FIG. 27 is a perspective view showing the structure of an optical fiber which makes the effective width of a bundle of peripheral edge exposure illumination light rays variable for controlling a quantity of exposure.

In FIG. 27, the emergent or emitting end of the optical fiber 21b has two slit-shaped emitting surfaces 21bA and 21bB. The two emitting surfaces are partitioned by a very thin shading band 21bC, which extends perpendicular to a scanning exposure direction. Also, the entrance end of the optical fiber 21b is divided into an entrance portion 21bD which corresponds to the emitting surface 21bA and an emitting portion 21bE which corresponds to the emitting surface 21bB. The entrance portions 21bD and 21bE are irradiated with illumination light rays $IL_s$ with a uniform intensity distribution, emitted from a light source.

Sub-shutters 39bA and 39bB are disposed near the entrance portions 21bD and 21bE, respectively. The shutter 36b of FIG. 15 may be provided between the sub-shutters 39bA and 39bB and the light source 35b. The sub-shutter 39bA shuts off and releases the entrance of the illumination light beams $IL_s$ onto the entrance portion 21bD, and the sub-shutter 39bB shuts off and releases the entrance of the illumination light beams $IL_s$ onto the entrance portion 21bE. With this arrangement, illumination light beams $IL_m$ are projected on a wafer through either or both of the emitting surfaces 21bA and 21bB of the optical fiber 21b.

As shown in FIG. 27, the widths $d_1$ and $d_2$ in the scanning exposure direction of the emitting surfaces 21bA and 21bB are set so as to differ from each other. If $2d_1=d_2$, the effective width D of a bundle of illumination light beams $IL_m$ for peripheral exposure can be varied in three steps by a combination of the opening and closing of the sub-shutters 39bA and 39bB. More specifically, if only the sub-shutter 39bA is opened, $D=d_1$. If only the sub-shutter 39bB is opened, $D=d_2=2d_1$, and if the sub-shutters 39bA and 39bB are both opened, $D=d_1+d_2=3d_1$.

Therefore, if $2d_1=d_2$ and the rotational speed of a wafer is assumed to be the same, the exposure quantity which is given to the resist film of the peripheral edge of the wafer can be switched to either 50% or 200%, when $D=d_2$ is taken to be 100%.

For that reason, if a term that specifies an effective width of a bundle of illumination light beams is provided when primary parameters at the time of test exposure are input, the set range of a target exposure quantity can be largely expanded by adjusting the rotational speed of a wafer, the intensity of the light emitted from a light source, or the transmittance of the extinction filter at the same time.

Figure 28:
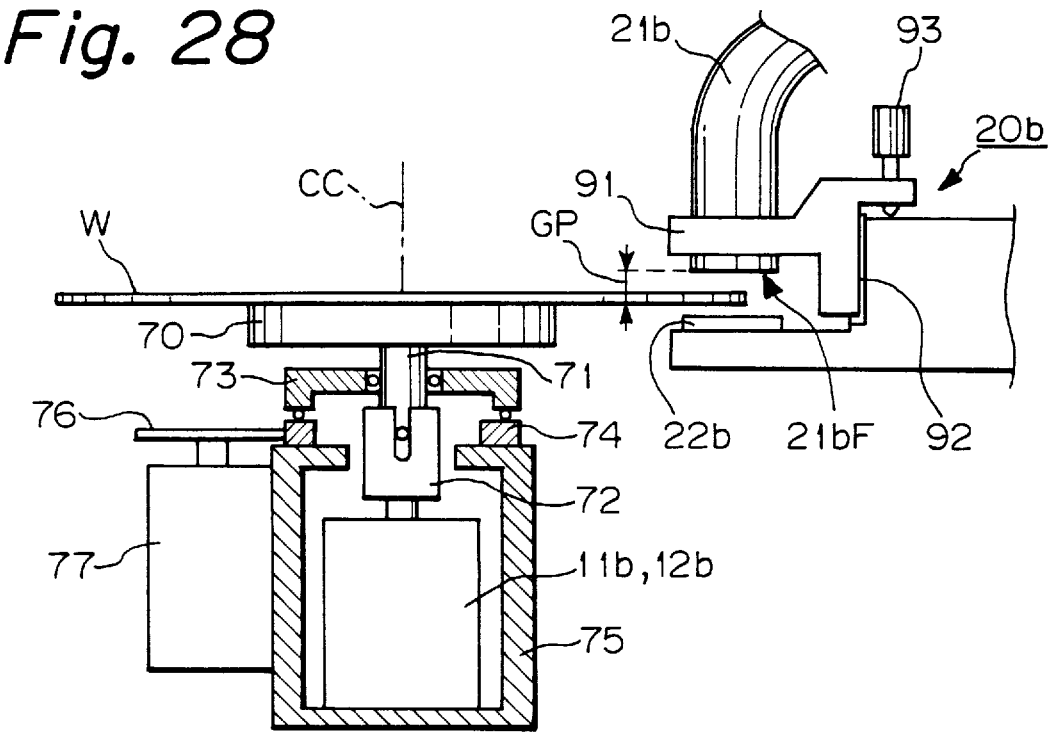
FIG. 28 is a diagram showing a partial modification of the peripheral edge exposure apparatus which is applied to each embodiment of the present invention.

As described above, a method of changing the spacing between the emitting end of the optical fiber 21b and the surface of a photosensitive substrate is considered as a method of adjusting an exposure quantity. FIG. 28 is a diagram showing a modification of equipment which can change the aforementioned spacing. In the figure, the same reference numerals and characters will be applied to the same members as those of FIG. 15.

In FIG. 15, the emitting end of the optical fiber 21b is fixed to the movable arm or slider 20b. However, in this embodiment the emitting end of an optical fiber 21b is fixed to a holding bracket 91 which is vertically movable by a few millimeters at the front end of a slider 20b. The bracket 91 is vertically movable along a dovetail groove 92, and the movement is performed by an adjustment screw 93. In a normal operating condition, the spacing $G_p$ between the emitting end 21bF of the optical fiber 21b and the surface of a wafer W is set to about 2 to 3 mm, but the spacing $G_p$ can be freely changed by turning the adjustment screw 93. If the spacing $G_p$ is increased, then the intensity of illumination light per area (illuminance) on the wafer W is reduced. If the spacing $G_p$ is decreased, conversely the illuminance is increased. Because the value of the spacing $G_p$ corresponds to the rotational angular position of the adjustment screw 93, it is beneficial to provide a scale plate which can be read directly from the rotational position of the screw 93.

Of course, the entire slider 20b may be slightly moved vertically with respect to the wafer W. In such a case, the adjustment of illuminance on the wafer W can be performed without changing the spacing between the emitting end 21bF of the optical fiber 21b and the light receiving surface of a photoelectric sensor 22b, as in FIG. 28.

In addition, the wafer W may be moved vertically with respect to the emitting end 21bF of the optical fiber 21b. In this case, the shaft 71 of a turn table 70 which holds the wafer W is coupled to the rotational shaft of a motor 11b through a coupling 72, as shown in FIG. 28. The coupling 72 has a structure which transmits rotation of the motor 11b to the shaft 71 of the turn table 70 and which allows the shaft 71 of the turn table 70 to move vertically. The shaft 71 of the turn table 70 is freely and rotatably supported by a circular bearing plate 73. The bearing plate 73 allows the shaft 71 of the turn table 70 to rotate but prevents the vertical movement of the shaft 71. The lower surface of the bearing plate 73 engages with three inclined portions formed on the upper surface of a circular cam plate 74 through balls or rollers. The circular cam plate 74 is rotatably provided on the upper surface of a fixing member 75 which fixes the motor 1.

Therefore, if the circular cam plate 74 is rotated, three inclined portions on the upper surface of the plate 74 move the balls or rollers in the vertical direction. The vertical motion is transmitted to the bearing plate 73, which causes the shaft 71 and the turn table 70 to move vertically. The circular cam plate 74 is rotated by a motor 77 through a speed reducing mechanism 76 such as a gear.

The motor 77 is required when the wafer W is automatically adjusted in the vertical direction. However, when the vertical position of the turn table 70 is manually set, a dial gauge, such as an adjustment provided instead provided instead of the motor, or the vertical position may be switched at two or three positions.

In the aforementioned way, the spacing $G_p$ can be freely adjusted in a certain range. The change in the spacing $G_p$ means that the illuminance of exposure light is varied on the wafer W and furthermore means that the size of a rectangular bundle of exposure light beams $IL_m$ (see FIG. 17) is slightly varied. In general, the numerical aperture (NA) on the emitting side of the optical fiber 21b is considerably large, so the exposure light from the emitting end 21bF of the optical fiber 21b has a large spread. Then, by obtaining in advance the information on the illuminance change and size change (especially width D) of a rectangular light beam $IL_m$ due to the change in the spacing $G_p$, there is also the need for correcting parameters (constants) associated with the width D in addition to the adjustment of the exposure quantity at the time of test exposure.

Notice that, when a ultraviolet laser beam with a better directivity as an exposure light can be used, it is also possible to reduce the numerical aperture (NA) of a bundle of emergent beams to a certain degree, that is, to obtain a bundle of nearly collimated beams, even when an optical fiber is used. Particularly in the case of an excimer laser beam source such as an ArF or KrF excimer laser beam source, the cross section of the laser beam is rectangular. Therefore, instead of an optical fiber, the laser beam, as it is, may be guided to a photosensitive substrate through a plurality of mirrors, or the laser beam may be shaped with lenses and guided to a photosensitive substrate.

Also, in a case where the spacing $G_p$ is changed with the optical fiber 21b, the structure near the emitting end 21bF can be modified so that the illuminance of a rectangular light beam $IL_m$ can be adjusted without substantially changing the dimension of the rectangular light beam $IL_m$. A preferred embodiment in this case will be described in reference to FIG. 29. The emitting end of an optical fiber 21b is fixed to an inner cylinder 96 which vertically slides within a circular hole 95 formed in the front end of a movable arm or slider 20b. An outer helicoid screw is formed on the upper portion of the outer periphery of the inner cylinder 96 and meshes with an inner helicoid screw formed in the inner peripheral portion of an outer cylinder 97. The outer cylinder 97 is rotatably attached to the slider 20b. If the outer cylinder 97 is rotated, then the inner cylinder 96 moves vertically.

On the other hand, between the emitting end 21bF of the optical fiber 21b and a wafer W, an illumination field diaphragm plate 98 for accurately prescribing a rectangular light beam $IL_m$ is fixed to the lower end of the hole 95 of the slider 20b. The diaphragm plate 98 has a long rectangular hole and is disposed so that the spacing $G_{p1}$ between the plate 98 and the wafer W is nearly constant (about 1 to 3 mm).

Therefore, if the outer cylinder 97 is rotated, the spacing $G_{p2}$ between the emitting end 21bF of the optical fiber 21b and the diaphragm plate 98 varies and the illuminance of the exposure light varies at the rectangular hole surface of the diaphragm plate 98. However, because the spacing $G_{p1}$ between the diaphragm plate 98 and the wafer W does not change, the size of a rectangular light beam $IL_m$ (a figure similar to the rectangular hole of the diaphragm plate 98) which is irradiated on the wafer W does not almost change.

Figure 29:
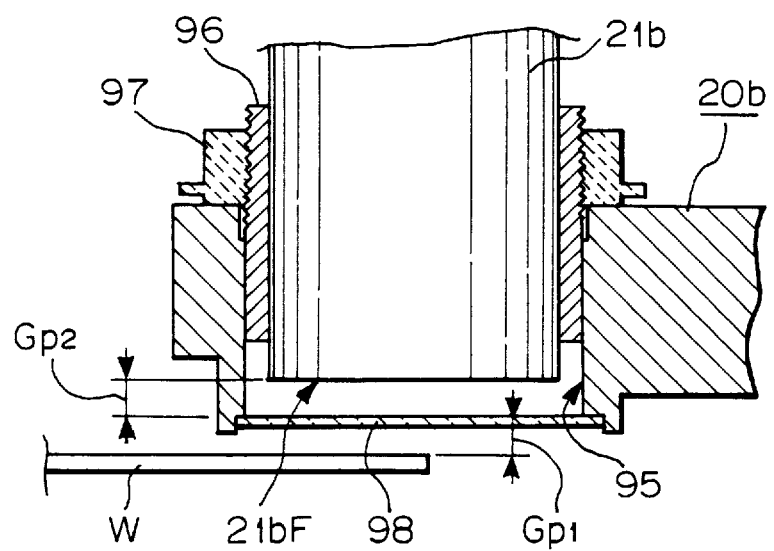
FIG. 29 is a diagram showing a modified example of the vicinity of the emergent end of the optical fiber of the peripheral edge exposure apparatus which is applied to each embodiment of the present invention.

The sum of the spacing $G_{p1}$ and the spacing $G_{p2}$ of FIG. 29 equals the spacing $G_p$ of FIG. 28, and only the illuminance of a rectangular light beam $IL_m$ on the wafer W can be effectively adjusted by changing the spacing between the emergent end 21bF and the wafer W. Notice that it is beneficial that graduations are provided on the outer periphery of the outer cylinder 97 so that the value of the spacing $G_{p2}$ or the sum of $G_{p1}$ and $G_{p2}$ can be directly read as the outer cylinder 97 is rotated.

The embodiments of the peripheral edge exposure method and apparatus according to the present invention have been described, however, in a wafer stepper for semiconductor device fabrication, the peripheral edge exposure apparatus is not always provided in a wafer carrier section. In the wafer stepper, a stand-alone peripheral edge exposure apparatus is provided in a clean room, and only wafers that are exposed with a plurality of steppers, or exposed wafers are batch-processed. In a case where the peripheral edge exposure apparatus of the present invention is used as a stand along type, of course the reticle carrier system 114b and the exposure system 132b of FIG. 16 are omitted.

Also, in the wafer stepper, it is considered that exposure of peripheral edge is increasingly used to prevent an occurrence of defective wafers caused due to dust. In that case, an operator, who uses a stepper which is constructed so that a peripheral edge exposure apparatus can be added in feature to a prealignment section (including a turn table and a flat-portion detector) which aligns the flat portion OF formed on the outer periphery of a wafer provided in the wafer carrier section of the stepper in one direction, chooses a desired one from different kinds of peripheral edge exposure apparatuses and adds the chosen apparatus to the wafer stepper.

In the above case, the basic kit of the optionally set peripheral edge exposure apparatus used in the aforementioned wafer stepper is roughly constituted by a hardware section consisting of the light source 35b, the shutter 36b, the drive control circuit 27b, the interface circuit 31b, and MPU 32b of FIG. 15 and a software section provided in the wafer carrier system 122b. The flat-portion detecting circuit 19b, the counter circuit 16b, and the motor drive circuit 13b of FIG. 15 are normally provided as the hardware on the side of the wafer loader and pre-alignment unit 33b, which is used together with the basic kit.

Incidentally, the unit constant of the hardware section of the basic kit slightly varies even when hardware sections are the same in catalog specification. For example, the dynamic characteristic (opening time, closing time, etc.) of the shutter 36b, the responsibility of a tracking servo system, control accuracy of exposure width $S_c$ (see FIG. 3), and an effective width D of a light beam $IL_m$ that is irradiated on a wafer have individual errors, respectively. Then, these unit constants are stored as unit constant data in a writable ROM (NV-RAM) of the MPU 32b before or after the basic kit is mounted in the wafer stepper. The aforementioned MPU 32b is connected to MPU the bus of the aforementioned wafer carrier system 122b. Thereafter, among blocks of data about unit constants, the data needed when the minicomputer 202b executes a program for peripheral edge exposure is sent to the minicomputer 202b through bus $S_{bs}$ when wafer carrier system 122b and peripheral edge exposure unit (MPU 32b) are initialized.

If the other subsystems 114b and 122b and units shown in FIG. 16 are constructed in the aforementioned way, the versions, unit constants, and states of all subsystems and units and the existence of optional units are fed back to the minicomputer 202b, when the minicomputer 202b commands all subsystems and units to perform an initialization operation after power is supplied to the wafer stepper.

With the aforementioned arrangement, the minicomputer 202b can set flags in advance to commands which cannot be used or commands which can be used but are not guaranteed with respect to accuracy and processing time, among a group of commands which have been set in the stepper as usable commands. With this, when an operator inputs a command for peripheral exposure or foreign substance inspection although no peripheral edge exposure unit and no foreign-substance inspection unit are mounted in, the minicomputer 202b can immediately inform the operator that the command is improper, before execution of the command.

As described above, for a subsystem or unit in the stepper where the version of software, the equipment constant, etc., can be changed in future, the data of that effect is stored in the MPU (or ROM) of that subsystem or unit. Therefore, if the minicomputer 202b adopts a method where the version or equipment constant of a subsystem or unit is read out as needed, then an improved portion in large number of programs of the minicomputer 202b can be considerably reduced.

In the aforementioned embodiments of the present invention, test exposure for exposing peripheral edge has been performed by relatively scanning a wafer (or plate) and a bundle of exposure illumination light beams $IL_m$ ($IL_1$, $IL_2$). However, when there is the need for accurately detecting the width D in the scanning exposure direction of a bundle of illumination light beams $IL_m$, spot printing is used. The spot printing is an exposure method where a light beam $IL_m$ is irradiated on a wafer or plate which is in stationary state. The control of the exposure quantity in such a case is performed by either or both of adjustment of the opening time of the shutter 36b and adjustment of the light intensity of a light beam $IL_m$.

Furthermore, in the aforementioned embodiments, it is the primary object to use a substrate with a resist film which is used for fabricating a semiconductor device or liquid crystal display device and evaluate the state of the remaining resist film when peripheral exposure is performed. However, when only the accuracy of a tracking servo system at the time of exposure is evaluated, a dummy substrate may be used where a photochromic layer or a layer of photomagnetic medium is formed on the surface of a substrate of the same size as a substrate for device fabrication.

In the above case, the layer of the peripheral portion of the dummy substrate receives irradiation of a bundle of exposure light beams and then changes in color or refractive index, so the boundary line between the exposed portion and the unexposed portion can be detected.

Therefore, if the space between the substrate edge and the boundary line is detected to obtain the exposure width $S_c$, tracking accuracy can be evaluated.

As a result of the detection, when an offset has occurred between a target exposure width and an actual exposure width $S_c$, a correction is made so that the offset is corrected when a tracking servo system is operated. It is not necessary to mention that the correction is possible by using the evaluation result of test exposure which uses a substrate with a resist film.

In accordance with the aforementioned embodiments of the peripheral edge exposure method and apparatus according to the present invention, the operation of the test exposure for finding out the optimum exposure conditions of peripheral exposure can be simplified and the number of photosensitive substrates that are used for test exposure can be considerably reduced.

In addition, since a plurality of peripheral portions of a wafer are exposed under different exposure conditions on one and the same photosensitive substrate, the present invention has the advantage that an operation of confirming the state of a resist film which remains unremoved after development or accuracy of exposure width becomes easy.

Furthermore, as a software for setting the optimum exposure conditions regions that are exposed by test exposure and regions exposed by test exposure can be visually recognized on the graphic display screen of a display which schematically shows the outer shape of a photosensitive substrate, an advantage of reducing mistaken setting is also obtainable.

What is claimed is:

1. A method of exposing, in a predetermined width, a peripheral region of a substrate having a sensitive layer, comprising the steps of:

transferring an image of a scale pattern to the sensitive layer of the peripheral region of the substrate to provide a dimension for the peripheral region of said substrate; and exposing the sensitive layer in the peripheral region of said substrate in the predetermined width without exposing a part of the image of the scale pattern transferred to the sensitive layer in the peripheral region of said substrate.

2. The method as set forth in claim 1, wherein said steps of transferring and exposing, respectively transfers the image of the scale pattern onto, and exposes the peripheral region along a circumference of the substrate which is substantially circular.

3. The method as set forth in claim 1, wherein said steps of transferring and exposing, respectively transfers the image of the scale pattern onto, and exposes the peripheral region on opposite edges of the substrate which is rectangular.

4. A method of exposing, in a predetermined width, a peripheral region of a substrate having a sensitive layer, comprising the steps of:

setting a plurality of separate exposure regions on the peripheral region of the substrate;

exposing the sensitive layer in the plurality of separate exposure regions using different target exposure quantities;

developing the plurality of separate exposure regions which have been exposed; and inspecting the sensitive layer at the separate exposure regions of the substrate for a remaining resist film to identify an appropriate exposure quantity based on the different target exposure quantities.

5. The method as set forth in claim 4, wherein said step of inspecting identifies the appropriate exposure quantity to be a value which is the product of a minimum target exposure quantity, where the remaining resist film of the sensitive layer becomes near zero, and a predetermined value.

6. The method as set forth in claim 4, wherein said step of setting sets the separate exposure regions along a circumference of the substrate which is substantially circular.

7. The method as set forth in claim 4, wherein said step of setting sets the separate exposure regions on two opposite edges of the substrate which is rectangular.

* * * * *